US011355915B2

United States Patent
Murata et al.

(10) Patent No.: US 11,355,915 B2
(45) Date of Patent: Jun. 7, 2022

(54) PROTECTION RELAY

(71) Applicant: Mitsubishi Electric Corporation, Tokyo (JP)

(72) Inventors: Kazuma Murata, Tokyo (JP); Shigetoo Oda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 104 days.

(21) Appl. No.: 16/975,902

(22) PCT Filed: Apr. 25, 2018

(86) PCT No.: PCT/JP2018/016757
§ 371 (c)(1),
(2) Date: Aug. 26, 2020

(87) PCT Pub. No.: WO2019/207673
PCT Pub. Date: Oct. 31, 2019

(65) Prior Publication Data
US 2021/0006059 A1 Jan. 7, 2021

(51) Int. Cl.
H02H 3/08 (2006.01)
H02H 9/02 (2006.01)
(Continued)

(52) U.S. Cl.
CPC ............. H02H 3/08 (2013.01); G01R 19/165 (2013.01); G01R 31/08 (2013.01); H02H 3/04 (2013.01); H02H 3/40 (2013.01)

(58) Field of Classification Search
CPC ... H02H 3/04; H02H 3/08; H02H 3/40; G01R 31/08; G01R 19/165
(Continued)

(56) References Cited

U.S. PATENT DOCUMENTS 4,073,008 A * 2/1978 Andow ................. G01R 19/04
327/90
4,857,854 A * 8/1989 Matsushima ........ G01R 31/088
324/512
5,170,308 A * 12/1992 Inagaki .................. H02H 7/045
361/36

FOREIGN PATENT DOCUMENTS

JP    S60204219 A    10/1985
JP    H01227613 A    9/1989
JP    2011250518 A   12/2011

OTHER PUBLICATIONS

Benmouyal, G. et al., "Experience With Subcycle Operating Time Distance Elements in Transmission Line Digital Relays", 37th Annual Western Protective Relay Conference, Washington, pp. 1-12, Sep. 13, 2010.

(Continued)

Primary Examiner — Jared Fureman
Assistant Examiner — Lucy M Thomas
(74) Attorney, Agent, or Firm — Buchanan, Ingersoll & Rooney PC

(57) ABSTRACT

A protection relay comprises a digital processing unit including: a first filter to eliminate a DC component in the time-series data, the first filter having a first window length; a second filter to eliminate a DC component in the time-series data, the second filter having a second window length shorter than the first window length; and a coefficient calculation unit to multiply an amplitude value of an output signal of the first filter and an amplitude value of an output signal of the second filter by first and second coefficients respectively, and integrate multiplication results. An operation determination is performed based on an output of the coefficient calculation unit. The first coefficient is decreased and the second coefficient is increased when a failure of the (Continued)

power system is detected, and thereafter, the first coefficient and the second coefficient are changed with a lapse of time.

12 Claims, 19 Drawing Sheets

(51) Int. Cl.
  *G01R 19/165* (2006.01)
  *G01R 31/08* (2020.01)
  *H02H 3/04* (2006.01)
  *H02H 3/40* (2006.01)

(58) Field of Classification Search
  USPC .......................................................... 361/93.1
  See application file for complete search history.

(56) References Cited

OTHER PUBLICATIONS

International Search Report (PCT/ISA/210) dated Jun. 12, 2018, by the Japan Patent Office as the International Searching Authority for International Application No. PCT/JP2018/016757.
Written Opinion (PCT/ISA/237) dated Jun. 12, 2018, by the Japan Patent Office as the International Searching Authority for International Application No. PCT/JP2018/016757.

* cited by examiner (A)

| ELAPSED TIME | k1 | k2 |
|---|---|---|
| 1T | 0.409056767 | 0.590943233 |
| 2T | 0.011830167 | 0.988169833 |
| 3T | −0.02271254 | 1.02271254 |
| 4T | 0.018155729 | 0.981844271 |
| 5T | 0.078617911 | 0.921382089 |
| 6T | 0.176907251 | 0.823092749 |
| 7T | 0.659232009 | 0.340767991 |
| 8T | −0.242749593 | 1.242749593 |
| 9T | −0.038789585 | 1.038789585 |
| 10T | 0.066351474 | 0.933648526 |
| 11T | 0.204254106 | 0.409056767 |

(A)

| ELAPSED TIME | k1 | k2 |
|---|---|---|
| 1T | 0 | 1 |
| 2T | 0 | 1 |
| 3T | 0.1 | 0.9 |
| 4T | 0.2 | 0.8 |
| 5T | 0.3 | 0.7 |
| 6T | 0.4 | 0.6 |
| 7T | 0.5 | 0.5 |
| 8T | 0.6 | 0.4 |
| 9T | 0.7 | 0.3 |
| 10T | 0.8 | 0.2 |
| 11T | 0.9 | 0.1 |

PROTECTION RELAY

TECHNICAL FIELD

The present disclosure relates to a protection relay, and to a digital protection relay used for protection of a power system, for example.

BACKGROUND ART

A digital protection relay includes an A/D (Analog-to-Digital) converter that performs A/D conversion of a sample value of voltage or current in a power system, and a digital filter that eliminates a DC component and the like other than a fundamental wave component from the sample value subjected to A/D conversion. A time length from a newest data point at a current time point to an oldest data point, of a plurality of data points used for digital filtering, is referred to as "window length".

In order to increase the accuracy of relay calculation, it is desirable to increase an attenuation rate of unnecessary components by using a digital filter having a long window length. However, by doing so, a problem of longer response time occurs.

In view of the above-described problem, a method using a plurality of digital filters having different window lengths in combination is known. For example, Japanese Patent Laying-Open No. 60-204219 (PTL 1) discloses that a first filter having a short window length is used during a time period from detection of a system failure to a first time, a second filter having a medium window length is used during a time period from the first time to a second time, and a third filter having a long window length is used after the second time.

An overcurrent relay disclosed in Japanese Patent Laying-Open No. 2011-250518 (PTL 2) includes a first overcurrent determination unit and a second overcurrent determination unit. The first overcurrent determination unit performs operation determination by comparing an effective value calculated using current data for a first time period with a first determination threshold value. The second overcurrent determination unit performs operation determination by comparing an effective value calculated using current data for a second time period shorter than the first time period with a second determination threshold value higher than the first determination threshold value. The overcurrent relay generates an operation output, based on a result of operation determination output at the earlier timing, of the results of operation determination by the first overcurrent determination unit and the second overcurrent determination unit.

CITATION LIST

Patent Literature

PTL 1: Japanese Patent Laying-Open No. 60-204219
PTL 2: Japanese Patent Laying-Open No. 2011-250518
PTL 3: Japanese Patent Laying-Open No. 01-227613

SUMMARY OF INVENTION

Technical Problem

If a digital filter having a short window length is used when the magnitude of a current changes abruptly, e.g., when a failure of a power system occurs, an overshoot occurs in a calculation result of an amplitude value. As a result, an error may occur in operation determination of a protection relay.

In the case of the protection relay in PTL 1 above, an influence of an overshoot on the determination accuracy can be reduced by adjusting the first and second times of filter switching. In the case of the protection relay in PTL 2 above, an influence of an overshoot on the determination accuracy can be reduced by adjusting settings of the first and second determination threshold values. However, adjusting the filter switching times or adjusting the determination threshold values for operation determination has limitations and it is difficult to further increase the operation determination accuracy.

The present disclosure has been made in view of the above-described problem and an object of the present disclosure is to provide a protection relay that can achieve both the response speed and the operation determination accuracy.

Solution to Problem

A protection relay according to one embodiment includes: an analog input circuit to generate time-series data by detecting a signal indicating current or voltage in a power system and performing A/D conversion of the detected signal; and an arithmetic circuit to perform digital processing based on the time-series data. The arithmetic circuit includes: a first filter; a second filter; a coefficient calculation unit; an operation determination unit; and a coefficient setting unit. The first filter attenuates or eliminates a DC component and at least some orders of harmonic components of the power system in the time-series data, and passes at least a part of a fundamental wave component of the power system in the time-series data, the first filter having a first window length. The second filter attenuates or eliminates a DC component and at least some orders of harmonic components of the power system in the time-series data, and passes at least a part of the fundamental wave component of the power system in the time-series data, the second filter having a second window length shorter than the first window length. The coefficient calculation unit multiplies a value based on an output signal of the first filter by a first coefficient, multiplies a value based on an output signal of the second filter by a second coefficient, and integrates multiplication results. The operation determination unit performs operation determination based on a result of integration by the coefficient calculation unit. The coefficient setting unit sets the first coefficient and the second coefficient. The coefficient setting unit decreases the first coefficient and increases the second coefficient when a failure of the power system is detected, and thereafter, changes the first coefficient and the second coefficient with a lapse of time.

Advantageous Effects of Invention

According to the above-described embodiment, both the response speed and the operation determination accuracy can be achieved by changing the first coefficient multiplied by the first filter and the second coefficient multiplied by the second filter with a lapse of time from the failure detection.

DESCRIPTION OF EMBODIMENTS

Figure 1:
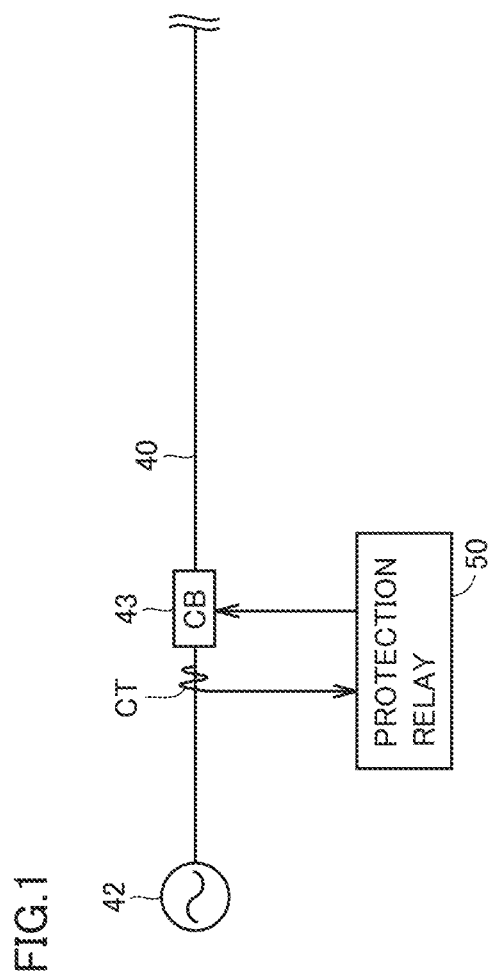
FIG. 1 shows a configuration example of a power system including a protection relay.

Hereinafter, each embodiment will be described in detail with reference to the drawings. Although an overcurrent relay is mainly illustrated by way of example in the following description, the present disclosure is not limited to the overcurrent relay. The same or corresponding portions will be denoted by the same reference characters and the description thereof will not be repeated.

First Embodiment

[Configuration Example of Power System]

FIG. 1 shows a configuration example of a power system including a protection relay. Referring to FIG. 1, a power supply 42 is provided at one end of a power transmission line 40. Although power transmission line 40 is a three-phase power transmission line, power transmission line 40 is shown by one line in FIG. 1 for ease of illustration.

A current transformer CT is provided on power transmission line 40. A circuit breaker (CB) 43 is further provided on power transmission line 40.

A protection relay 50 obtains, from current transformer CT, a signal indicating a three-phase AC current flowing through power transmission line 40. Protection relay 50 samples the obtained current signal and performs Analog-to-Digital (A/D) conversion of the obtained current signal, to thereby generate current data. The current data may be referred to as "time-series current data", or simply "time-series data". Protection relay 50 performs overcurrent relay calculation based on the generated current data, and as a result, outputs a trip signal for opening circuit breaker 43, when an abnormality is detected. Although the case of the overcurrent relay has been described above, the same applies to the case of the other relay elements (e.g., the case of using voltage data based on a three-phase AC voltage).

[Example Hardware Configuration of Protection Relay]

Figure 2:
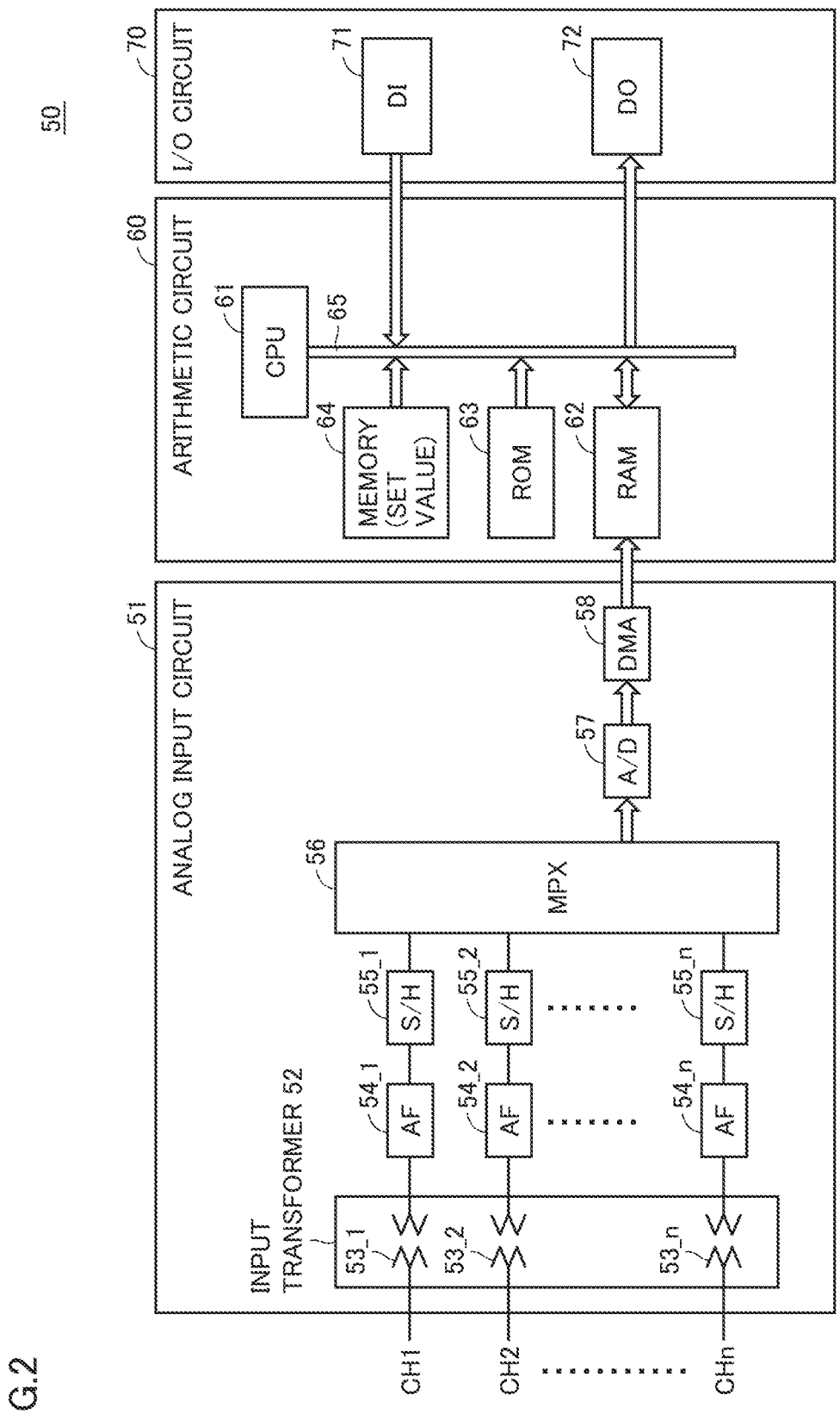
FIG. 2 is a block diagram showing an example hardware configuration of the protection relay in FIG. 1.

FIG. 2 is a block diagram showing an example hardware configuration of the protection relay in FIG. 1. Protection relay 50 in FIG. 2 is configured similarly to a so-called digital relay device. Specifically, referring to FIG. 2, protection relay 50 includes an analog input circuit 51, an arithmetic circuit 60, and an input and output (I/O) circuit 70.

Analog input circuit 51 includes an input transformer 52, analog filters (AFs) 54_1, 54_2, ..., 54_n, sample hold circuits (S/Hs) 55_1, 55_2, ..., 55_n, a multiplexer (MPX) 56, an A/D converter 57, and a direct memory access (DMA) controller 58.

Input transformer 52 includes auxiliary transformers 53_1, 53_2, ..., 53_n for respective input channels. Input transformer 52 receives the current signal from current transformer CT in FIG. 1. Each auxiliary transformer 53 converts the current signal from current transformer CT into a signal having a voltage level suitable for signal processing in analog input circuit 51 and arithmetic circuit 60. Analog filter 54 and sample hold circuit 55 are provided for each channel of the input signal.

Each analog filter 54 is a low pass filter provided to eliminate an aliasing error during A/D conversion. Each sample hold circuit 55 samples and holds, at a prescribed sampling frequency, the signal that has passed through its corresponding analog filter 54. The sampling frequency is, for example, 4800 Hz.

Multiplexer 56 sequentially selects voltage signals held in sample hold circuits 55_1, 55_2, ..., 55_n. A/D converter 57 converts the signal selected by multiplexer 56 into a digital value.

DMA controller 58 transfers the digital data output from A/D converter 57 to a RAM 62.

Arithmetic circuit 60 includes a central processing unit (CPU) 61, random access memory (RAM) 62, a read only memory (ROM) 63, a memory 64, and a bus 65 that connects these components. CPU 61 operates in accordance with a program, thereby controlling the overall operation of protection relay 50. RAM 62 and ROM 63 are used as main memory of CPU 61. Non-volatile memory such as flash memory is used as memory 64, and thus, memory 64 can store a program, a set value for signal processing, and the like.

Arithmetic circuit 60 may only be implemented by some kind of circuit and is not limited to the example in FIG. 2. For example, arithmetic circuit 60 may include a plurality of CPUs. Alternatively, instead of a processor such as the CPU, arithmetic circuit 60 may be implemented by at least one application specific integrated circuit (ASIC), or by at least one field programmable gate array (FPGA). Alternatively, arithmetic circuit 60 may be implemented by any combination of the processor, the ASIC and the FPGA.

I/O circuit 70 includes a digital input (D/I) circuit 71 and a digital output (D/O) circuit 72. Digital input circuit 71 and digital output circuit 72 are interface circuits for communication between CPU 61 and an external device. For example, digital output circuit 72 outputs the trip signal to a circuit breaker 43A or 43B on its own end side shown in FIG. 1.

[Configuration of Digital Processing Unit]

Next, the contents of digital processing implemented by arithmetic circuit 60 will be described in detail. The following function is described as being implemented by CPU 61 operating in accordance with a program. However, as described above, arithmetic circuit 60 may be implemented by the ASIC, the FPGA or the like. Although an overcurrent relay is mainly illustrated by way of example in the following description, the present disclosure is not limited to the overcurrent relay.

Figure 3:
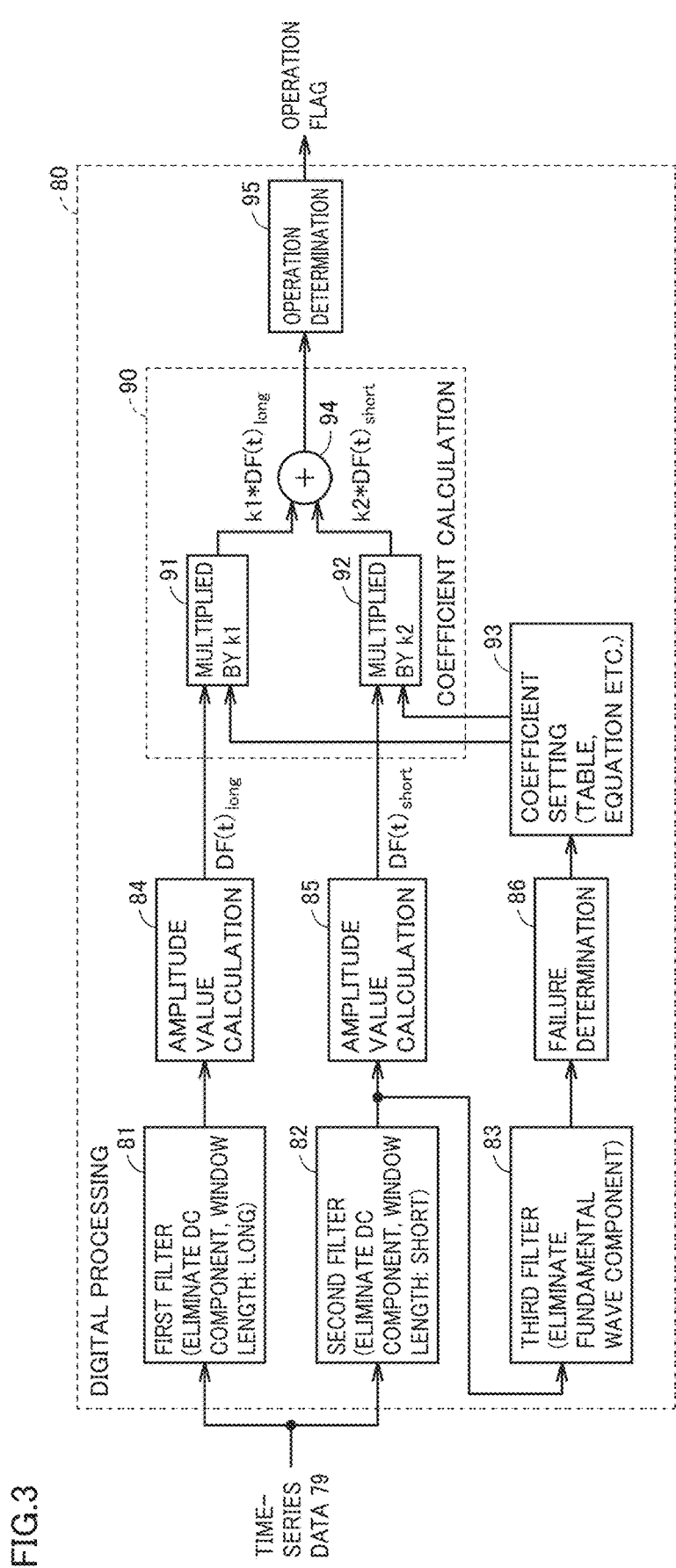
FIG. 3 is a functional block diagram for illustrating digital processing implemented by an arithmetic circuit in FIG. 2.

FIG. 3 is a functional block diagram showing a configuration of a digital processing unit implemented by the arithmetic circuit in FIG. 2. Referring to FIG. 3, a digital processing unit 80 includes a first filter 81, a second filter 82, a third filter 83, amplitude value calculation units 84 and 85, a failure determination unit 86, a coefficient calculation unit 90, and an operation determination unit 95. Time-series data 79 (i.e., the current data and/or the voltage data of the power system) captured in RAM 62 is input to digital processing unit 80. In the example in FIG. 3, time-series data 79 is the current data of the power system.

Each of first filter 81 and second filter 82 is a digital filter that can be implemented as a finite impulse response (FIR) filter. First filter 81 and second filter 82 are configured to eliminate, from time-series data 79, a DC component and at least some orders of harmonic components that become an obstacle to relay calculation and relay characteristics. First filter 81 and second filter 82 pass at least a part of a fundamental wave component of the power system that is necessary for relay calculation. Particularly, first filter 81 is configured to block or attenuate a DC component as much as possible, attenuate harmonic components of the power system as much as possible, and pass a fundamental wave component of the power system as much as possible. A frequency characteristic of second filter 82 may be different from a frequency characteristic of first filter 81. Specifically, although second filter 82 blocks or attenuates a DC component as much as possible, a rate of attenuation of harmonic components by second filter 82 may be lower than a rate of attenuation of harmonic components by first filter 81.

Furthermore, a window length of first filter 81 is longer than a window length of second filter 82.

Let us assume, for example, that a relay calculation cycle T is 30° in electrical angle, and a filter function is indicated by a difference between a current value i(t) at a current time point and a current value i(t−2T) at a time point earlier than the current time point by 60°. In this case, a window length is 2T=60°. In the following description, i(t−2T) may be simply denoted as i(t−2).

As described above, the window length of first filter 81 is longer than the window length of second filter 82, and thus, first filter 81 can further attenuate the harmonic components and extract the fundamental wave component with a higher degree of accuracy than second filter 82. Conversely, the harmonic components are included in the output of second filter 82 without being attenuated, as compared with the case of first filter 81. Therefore, in performing amplitude value calculation by using the time-series data at the time of an abrupt increase in current caused by the occurrence of a failure, operation can be performed with a higher degree of accuracy by using the data that has passed through first filter 81 than by using the data that has passed through second filter 82, because the harmonic components are included transiently.

As to the responsiveness when the input time-series data (current data and/or voltage data) changes, first filter 81 is slower than second filter 82. Immediately after a failure of the power system occurs (specifically, during a time period corresponding to the window length), first filter 81 performs filter calculation using both the data before the occurrence of the failure and the data after the occurrence of the failure.

Third filter 83 is a digital filter that can be implemented as an FIR filter. Third filter 83 eliminates the fundamental wave component from the output data of second filter 82, to thereby detect an abrupt change at the time of the occurrence of a failure. Third filter 83 outputs at least a part of the components other than the fundamental wave component. The output of third filter 83 is used for determination of a failure, and thus, third filter 83 is configured such that an abnormality output continues for a certain time period or longer when a failure occurs.

First amplitude value calculation unit 84 calculates an amplitude value using the time-series data output from first filter 81. Second amplitude value calculation unit 85 calculates an amplitude value using the time-series data output from second filter 82. A method for amplitude value calculation is not particularly limited, and a method described in Japanese Patent Laying-Open No. 01-227613 (PTL 3) can, for example, be used.

Specifically, when i(t) represents the current value at the current time point, and i(t−1), i(t−2) and i(t−3) represent current values at time points earlier than the current time point by 30°, 60° and 90° in electrical angle, respectively, a current amplitude I can be obtained as follows:

$$I^2 = [i(t-1) \cdot i(t-2) - i(t) \cdot i(t-3)] / [\sin 30° \cdot \sin 60°] \quad (1).$$

A more general equation is disclosed in PTL 3 above.

Failure determination unit 86 determines whether or not the power system has a failure, based on the output of third filter 83. For example, when the magnitude of the output of third filter 83 is larger than a threshold value, failure determination unit 86 determines that the power system has a failure. Since third filter 83 eliminates the fundamental wave component, the magnitude of the output of third filter 83 is substantially zero when the amplitude of the time-series data does not change. When a failure occurs in the power system, the magnitude of the current and the phase change greatly, which transiently causes a situation in which the harmonic components occurs. Therefore, third filter 83 outputs a signal larger than the threshold value.

Coefficient calculation unit 90 includes a multiplier 91, a multiplier 92, an adder 94, and a coefficient setting unit 93.

Multiplier 91 multiplies the amplitude value (i.e., $DF(t)_{long}$) of first filter 81 output from amplitude value calculation unit 84 by a coefficient k1. Similarly, multiplier 92 multiplies the amplitude value (i.e., $DF(t)_{short}$) of second filter 82 output from amplitude value calculation unit 85 by a coefficient k2. Adder 94 adds $k1 \cdot DF(t)_{long}$, which is the output of multiplier 91, and $k2 \cdot DF(t)_{short}$, which is the output of multiplier 92, and outputs an addition result.

Coefficient setting unit 93 sets values of coefficients k1 and k2 in accordance with a predetermined correspondence relation between coefficients k1 and k2 and the time elapsed after a failure is detected. The correspondence relation is stored in the memory in the form of a table or an equation.

Specifically, when a notification of a failure of the power system is not provided from failure determination unit 86, coefficient setting unit 93 sets k1 at 1 and k2 at 0, for example. As a result, the presence or absence of an overcurrent is determined based on the current amplitude calculated using the output value of first filter 81 having a longer window length. Therefore, a malfunction of the overcurrent relay caused by, for example, an unexpected surge current can be prevented.

In contrast, when a notification of a failure of the power system is provided from failure determination unit 86, coefficient setting unit 93 abruptly decreases coefficient k1 and abruptly increases coefficient k2. For example, k1 is set at 0 and k2 is set at 1. As a result, the responsiveness of protection relay 50 can be increased. Thereafter, coefficient setting unit 93 gradually changes the values of coefficients k1 and k2 with a lapse of time, and finally to the original values of coefficients k1 and k2 or the values close thereto (e.g., k1=1, k2=0). By gradually changing the values of coefficients k1 and k2 as described above, an amount of overshoot can be reduced.

Figure 4:
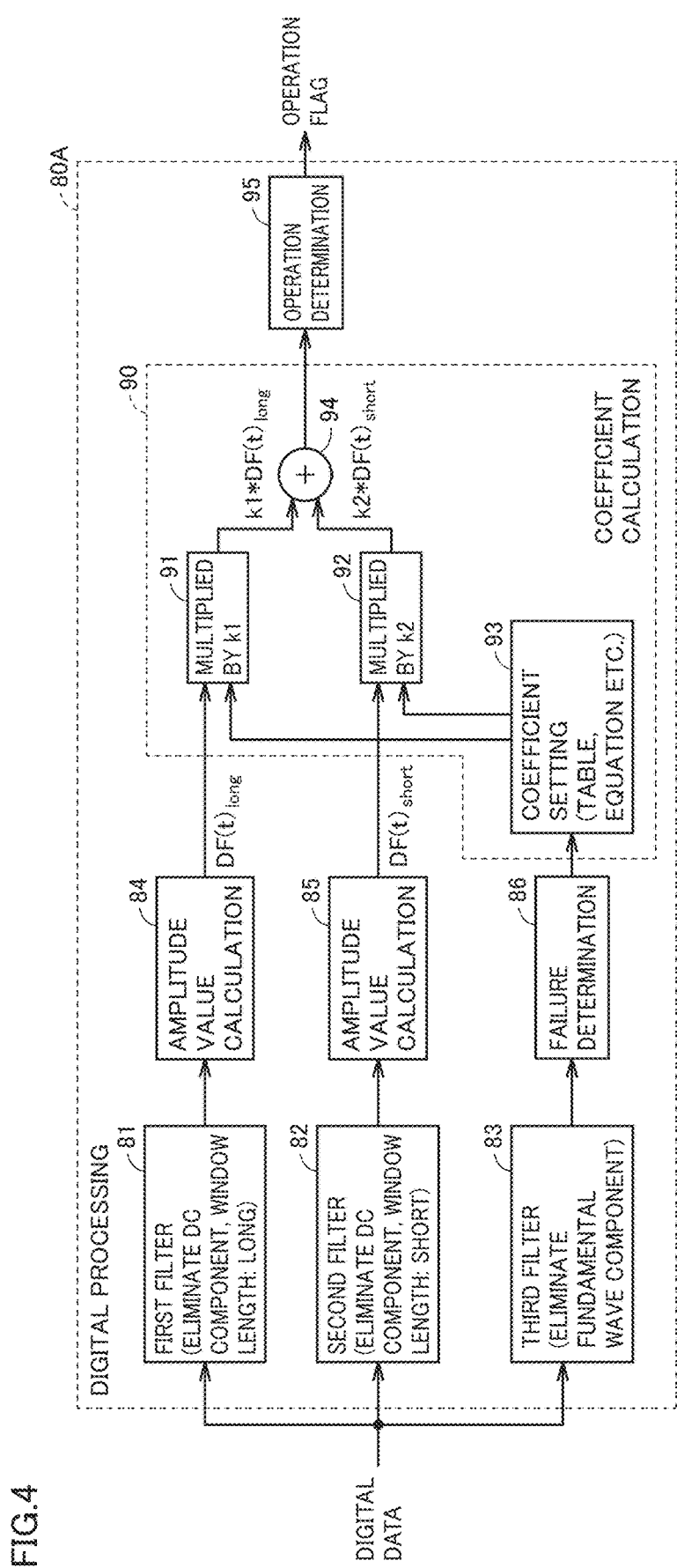
FIG. 4 is a functional block diagram showing a modification of FIG. 3.

FIG. 4 is a functional block diagram showing a modification of FIG. 3. A digital processing unit 80A in FIG. 4 is different from digital processing unit 80 in FIG. 3 in that, instead of the output of second filter 82, time-series data 79 (i.e., the current data and/or the voltage data of the power system) captured in RAM 62 is input to third filter 83. Since the remaining portions in FIG. 4 are the same as those of FIG. 3, the same or corresponding portions will be denoted by the same reference characters and the description will not be repeated. The configuration in FIG. 4 can also provide the function that is substantially similar to that of FIG. 3.

[Operation of Digital Processing Unit]

Figure 5:
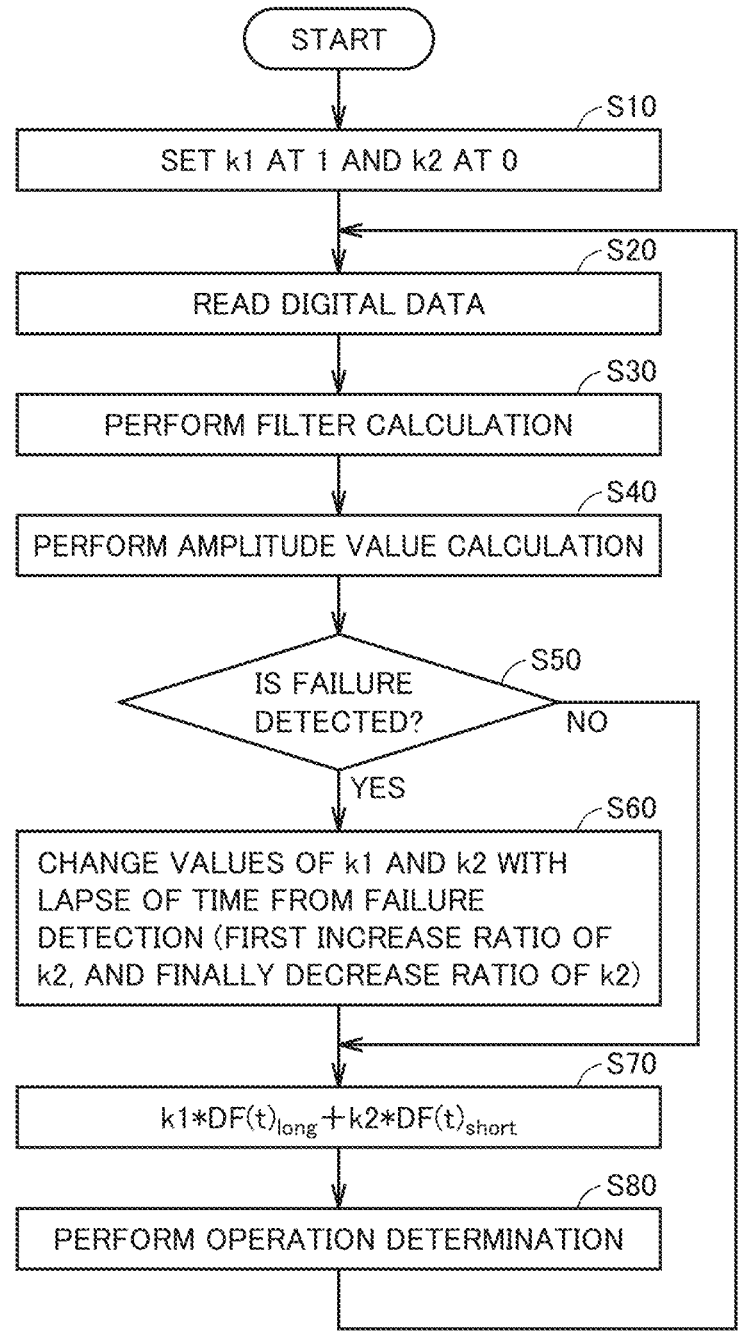
FIG. 5 is a flowchart showing a process procedure by the arithmetic circuit in FIG. 2.

FIG. 5 is a flowchart showing a process procedure by the arithmetic circuit in FIG. 2. The flowchart in FIG. 5 shows the operation of the digital processing unit in each of FIGS. 3 and 4 in chronological order. Each step in FIG. 5 is performed by CPU 61 in FIG. 2.

First, in step S10 in FIG. 5, CPU 61 sets coefficients k1 and k2 at initial values when the power system does not have a failure. For example, CPU 61 sets k1 at 1 and k2 at 0. By using the output of first filter 81 having a longer window length, erroneous determination based on a surge current or the like can be prevented.

Next, in step S20, CPU 61 extracts the data necessary for filter calculation from RAM 62. As described above, the time-series current data and/or voltage data detected from the power system and subjected to A/D conversion is stored in RAM 62.

Next, in step S30, using the read data, CPU 61 performs filter calculation with first filter 81, second filter 82 and third filter 83 described above.

Each of first filter 81 and second filter 82 is an FIR filter that eliminates a DC component and certain harmonic components. When a failure occurs, the DC component and the harmonic components greatly increase transiently, and thus, it is important to eliminate the DC component and the harmonic components in order to reduce a calculation error of amplitude value calculation. Furthermore, first filter 81 and second filter 82 are characterized in that the window length of first filter 81 is longer than the window length of second filter 82. Although both first filter 81 and second filter 82 pass at least a part of a fundamental wave component, first filter 81 and second filter 82 are different in degree of transmission. When each filter output is standardized with respect to the fundamental wave component, the harmonic components are less attenuated and a value of a certain harmonic component may be larger than that of the fundamental wave in second filter 82 as compared with in first filter 81. In addition, when the input changes abruptly, the output of the second filter having a shorter window length follows the data after the occurrence of the failure more quickly. However, the second filter is more likely to undergo an overshoot (i.e., a phenomenon in which the amplitude value calculation result becomes greater than the actual input transiently).

Third filter 83 is an FIR filter that eliminates the fundamental wave component. When the magnitude of the current of the power system does not change, the magnitude of the output of third filter 83 is substantially zero. When a failure occurs in the power system, the current changes greatly, and thus, the components other than the fundamental wave component increase. As a result, the magnitude of the output of third filter 83 increases in accordance with an amount of abrupt change in current.

Next, in step S40, CPU 61 calculates an amplitude value of the output signal of first filter 81, and calculates an amplitude value of the output signal of second filter 82. Any known method may be used as a method for amplitude value calculation, without particular limitation.

Next, in step S50, CPU 61 determines whether or not the power system has a failure, based on the output of third filter 83. For example, when a state in which the magnitude of the output of third filter 83 is larger than a preset threshold value continues for a predetermined verification time period (e.g., 2T), CPU 61 determines that the power system has a failure.

When the failure of the power system is not detected as a result of the above-described determination (NO in step S50), CPU 61 uses the initialized values of coefficients k1 and k2 to multiply amplitude value $DF(t)_{long}$ of the output signal of first filter 81 by coefficient k1 and multiply amplitude value $DF(t)_{short}$ of the output signal of second filter 82 by coefficient k2 in step S70. CPU 61 adds multiplication results. Next, in step S80, CPU 61 performs operation determination based on an addition result. In this case, the addition result is substantially determined by the output of first filter 81, and thus, erroneous determination in the overcurrent relay based on an unexpected surge current or the like can be prevented. Thereafter, the procedure is repeated from step S20.

In contrast, when the failure of the power system is detected as a result of the determination in step S50, CPU 61 changes the values of coefficients k1 and k2 based on the pre-made table or equation, with a lapse of time from the failure detection time (step S60). Specifically, when the failure is detected, CPU 61 increases a ratio of coefficient k2 to coefficient k1, and finally decreases the ratio of coefficient k2 to coefficient k1. In this case, the values of coefficients k1 and k2 may be changed to satisfy the relation of k1+k2=1.

Next, in step S70, CPU 61 calculates $k1*DF(t)_{long}+k2*DF(t)_{short}$, using the values of coefficients k1 and k2 changed in step S60. Next, in step S80, CPU 61 performs operation determination based on a result of calculation in step S70. For example, when the calculation result is larger than a threshold value, CPU 61 sets an operation flag at 1, to thereby open the circuit breaker.

[Effect of First Embodiment]

As described above, according to the protection relay of the first embodiment, first filter 81 and second filter 82 having different window lengths are used and operation determination is performed based on the sum of the output signal of first filter 81 multiplied by k1 and the output signal of second filter 82 multiplied by k2. When a failure of the power system is detected, the above-described first coefficient is decreased and the above-described second coefficient is increased, and thereafter, the above-described first coefficient and the above-described second coefficient are changed with a lapse of time. As a result, there can be provided a protection relay that can suppress the occurrence of an overshoot and achieve both the response speed and the operation determination accuracy.

Second Embodiment

In a second embodiment, specific examples of first filter 81, second filter 82 and third filter 83 described in the first embodiment, and a specific method for setting coefficients k1 and k2 will be described.

[Specific Examples of First and Second Filters]
(First Filter 81)

Specifically, a full cycle cosine filter is used as first filter 81. Assuming that relay calculation cycle T is 30° in electrical angle, the full cycle cosine filter is expressed as follows:

$$i(t)+i(t-1)\cdot\cos 30°+i(t-2)\cdot\cos 60°+i(t-3)\cdot\cos 90°+i(t-4)\cdot\cos 120°+i(t-5)\cdot\cos 150°+i(t-6)\cdot\cos 180°+i(t-7)\cdot\cos 210°+i(t-8)\cdot\cos 240°+i(t-9)\cdot\cos 270°+i(t-10)\cdot\cos 300°+i(t-11)\cdot\cos 330° \quad (2).$$

Therefore, a window length of the full cycle cosine filter is 330° in electrical angle.

Figure 6:
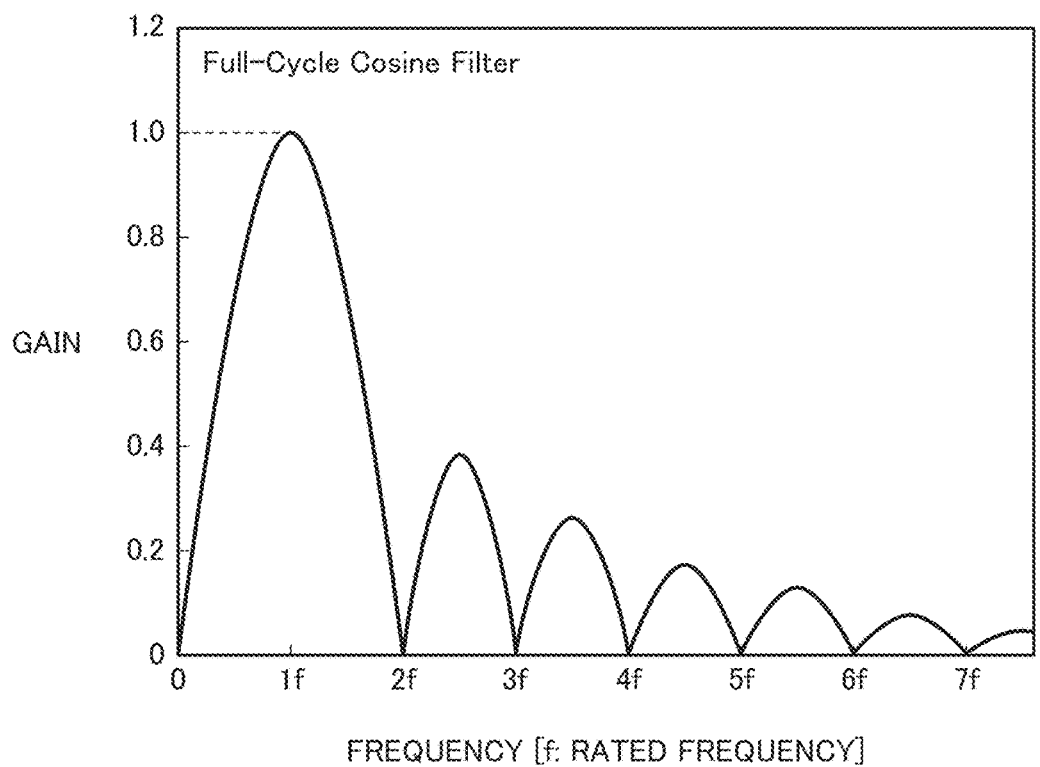
FIG. 6 shows a gain characteristic of a full cycle cosine filter.

FIG. 6 shows a gain characteristic of the full cycle cosine filter. In FIG. 6, the horizontal axis represents a frequency standardized by a rated frequency f of the power system, and the vertical axis represents a gain. As shown in FIG. 6, a DC component and harmonic components that are integral multiples of rated frequency f are completely eliminated. In addition, a fundamental wave component passes through the full cycle cosine filter without being attenuated. In addition, as to a phase characteristic, a signal having the rated frequency is output with a delay of 360°.

(Second Filter 82)

A 60° difference filter is used as second filter 82. The 60° difference filter is expressed as follows:

$$i(t)-i(t-2) \quad (3).$$

Where, relay calculation cycle T is 30° in electrical angle. Therefore, a window length of the 60° difference filter is 60° in electrical angle.

Figure 7:
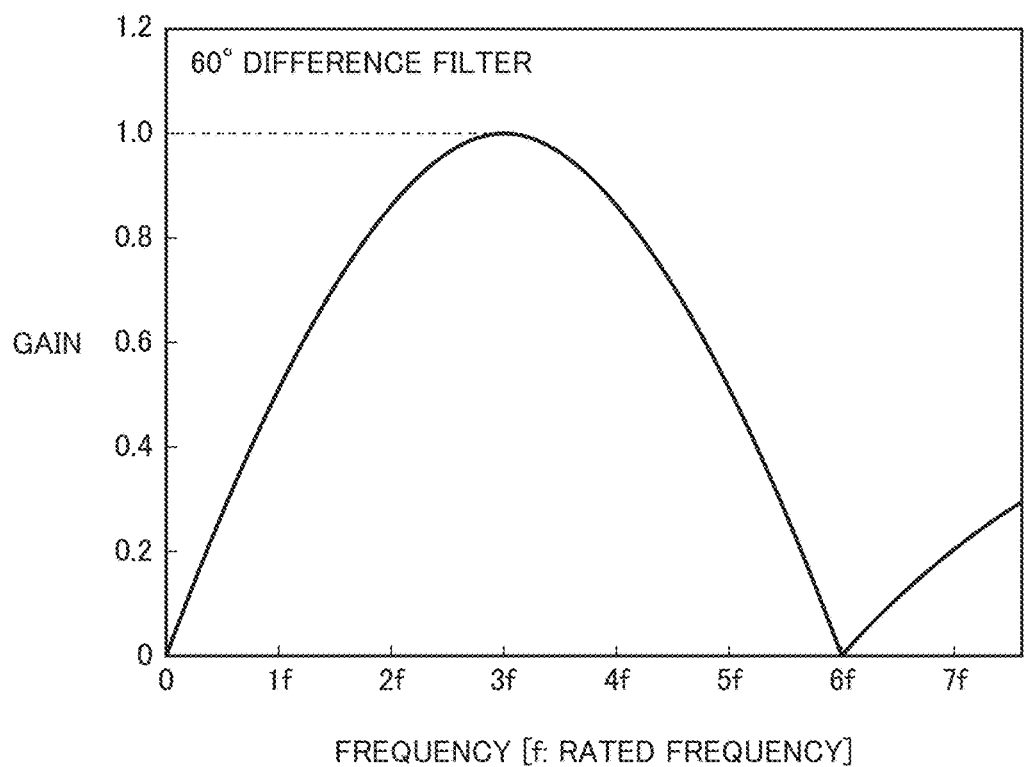
FIG. 7 shows a gain characteristic of a 60° difference filter.

FIG. 7 shows a gain characteristic of the 60° difference filter. As shown in FIG. 7, a DC component is completely attenuated. A signal having the fundamental wave component is attenuated, although the signal having the fundamental wave component passes through the 60° difference filter. In addition, as to a phase characteristic, a signal having the rated frequency is output with a phase lead of 60°.

[Method for Setting Coefficients k1 and k2]

Figure 8:
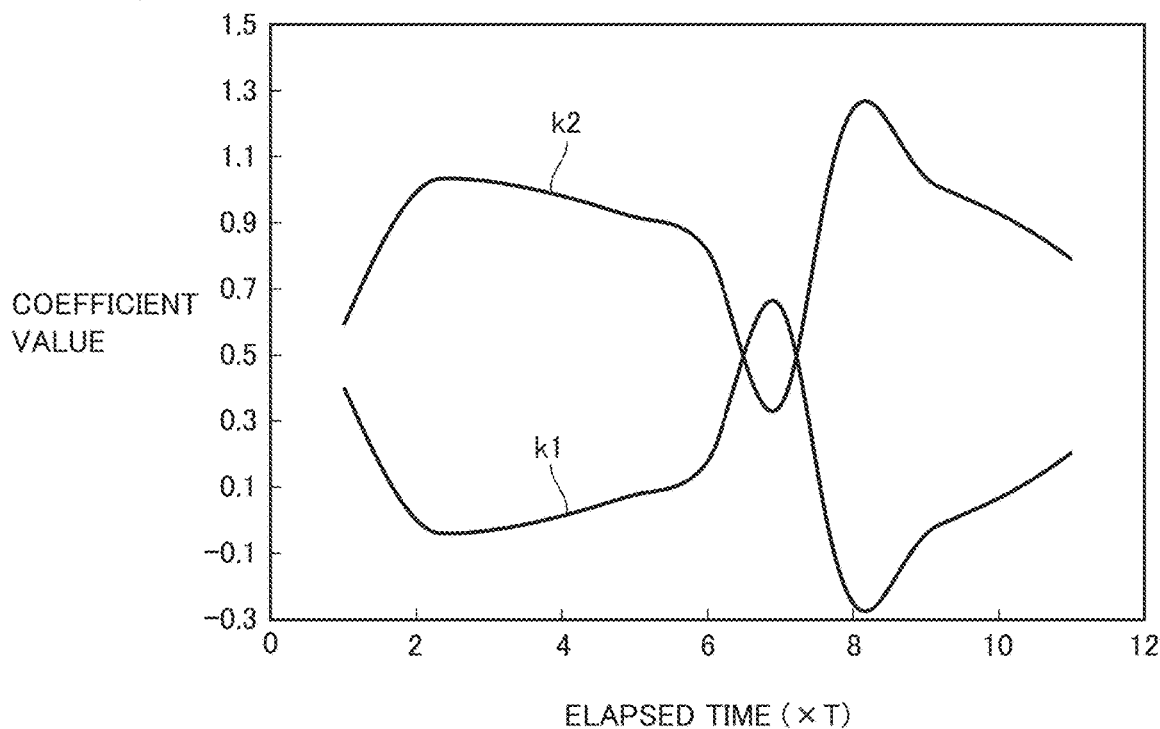
FIG. 8 shows setting examples of coefficient values k1 and k2 in a second embodiment.

FIG. 8 shows setting examples of coefficient values k1 and k2 in the second embodiment. In FIG. 8(A), coefficient values k1 and k2 are shown in the form of a table, and in FIG. 8(B), values k1 and k2 are shown in the form of a graph. In FIG. 8(A), the time elapsed after a failure of the power system is detected is shown with respect to relay calculation cycle T (T corresponds to 30° in electrical angle). That is, coefficient values k1 and k2 change after the time period of 1T elapses from the failure detection.

As shown in FIG. 8(B), when a failure of the power system is detected, coefficient setting unit 93 abruptly decreases first coefficient k1 and abruptly increases second coefficient k2. Thereafter, coefficient setting unit 93 increases first coefficient k1 and decreases second coefficient k2, and then, again decreases first coefficient k1 and increases second coefficient k2. Thereafter, coefficient setting unit 93 increases the first coefficient and decreases the second coefficient. By changing coefficients k1 and k2 as described above, an overshoot that occurs in the output signal of coefficient calculation unit 90 can be reduced.

The specific values of coefficients k1 and k2 are obtained by simulation. A method therefor will be specifically described below.

Figure 9:
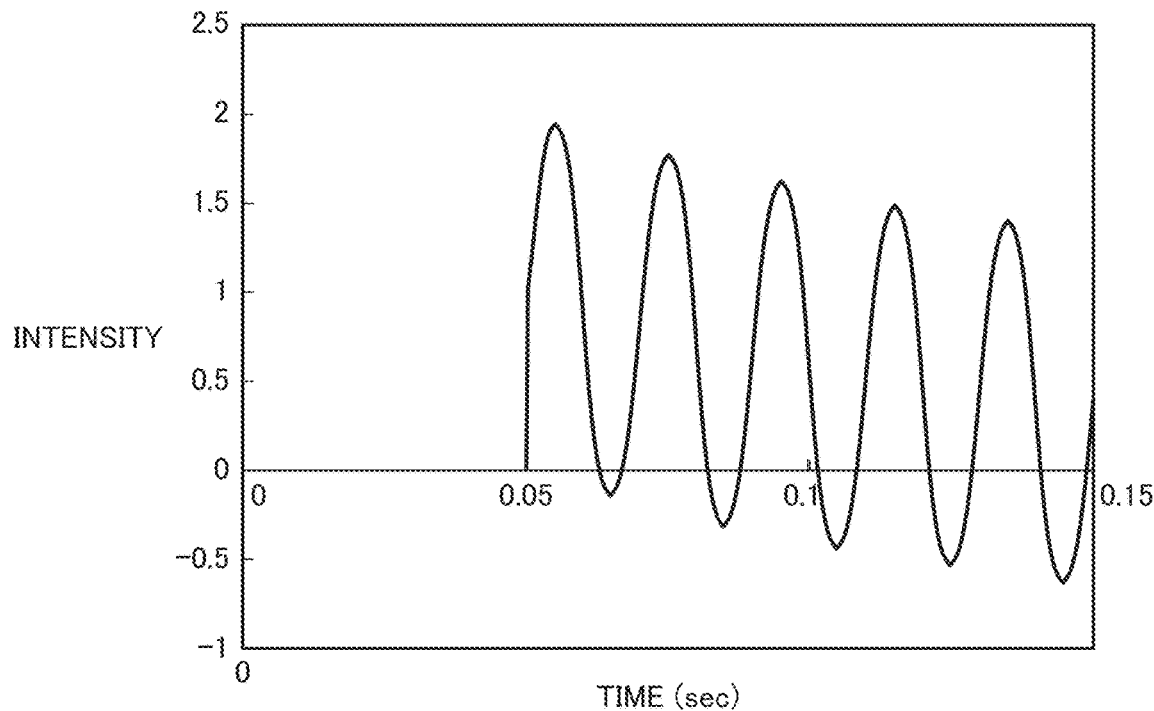
FIG. 9 shows a filter input waveform in simulation.

FIG. 9 shows a filter input waveform in simulation. Generally, a current value when a failure occurs in a power system is indicated by an overlap of an AC component and a DC component. When R represents a resistance component and L represents an inductance component in power transmission line 40 of FIG. 1, a time constant τ at which the DC component changes is expressed as L/R. When φ is defined as $\varphi=\tan^{-1} \omega L/R$ (where ω represents an angular frequency of a fundamental wave of the power system) and ϕ represents an instantaneous voltage phase at the time of occurrence of a failure, the magnitude of the DC component is maximized when ϕ−φ=90° or 270° (generally, when an instantaneous value of a voltage is near zero).

In simulation, a current waveform when the magnitude of the DC component is maximized as described above is used as a virtual waveform of filter input. Coefficients k1 and k2 are determined such that excellent responsiveness and accuracy are obtained even under such severest conditions.

Specifically, the input current waveform shown in FIG. 9 is expressed as follows:

$$i(t)=0, \text{ where } 0 \leq t < 0.05 \text{(sec)} \quad (4A)$$

$$i(t)=\sin(\omega t)+\exp(-t/\tau), \text{ where } t \geq 0.05 \text{(sec)} \quad (4B).$$

It is assumed that a simple failure such as a one-phase ground fault occurs at time t=0.05 (sec). System frequency f is set at 50 Hz, and relay calculation cycle T is set at 1.667 msec (corresponding electrical angle is 30°).

Figure 10:
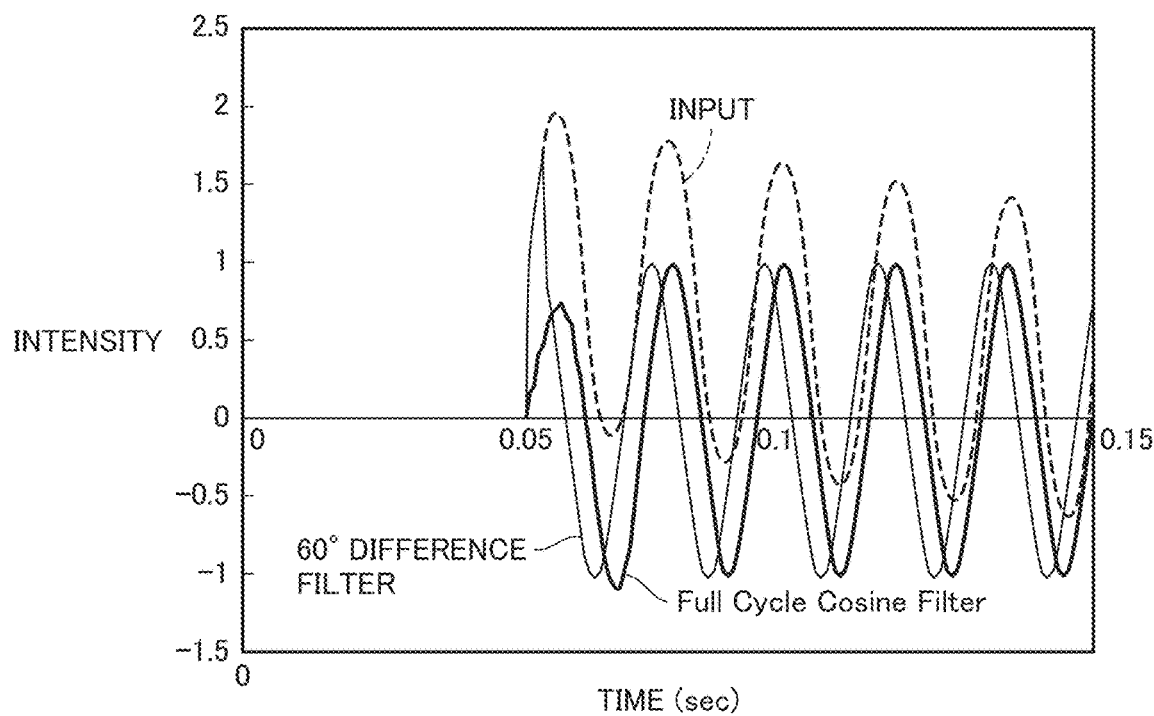
FIG. 10 shows filter output waveforms with respect to the input waveform in FIG. 9.

FIG. 10 shows filter output waveforms with respect to the input waveform in FIG. 9. In FIG. 10, the input signal waveform is shown by a broken line, an output waveform of the full cycle cosine filter is shown by a thick solid line, and an output waveform of the 60° difference filter is shown by a thin solid line.

Figure 11:
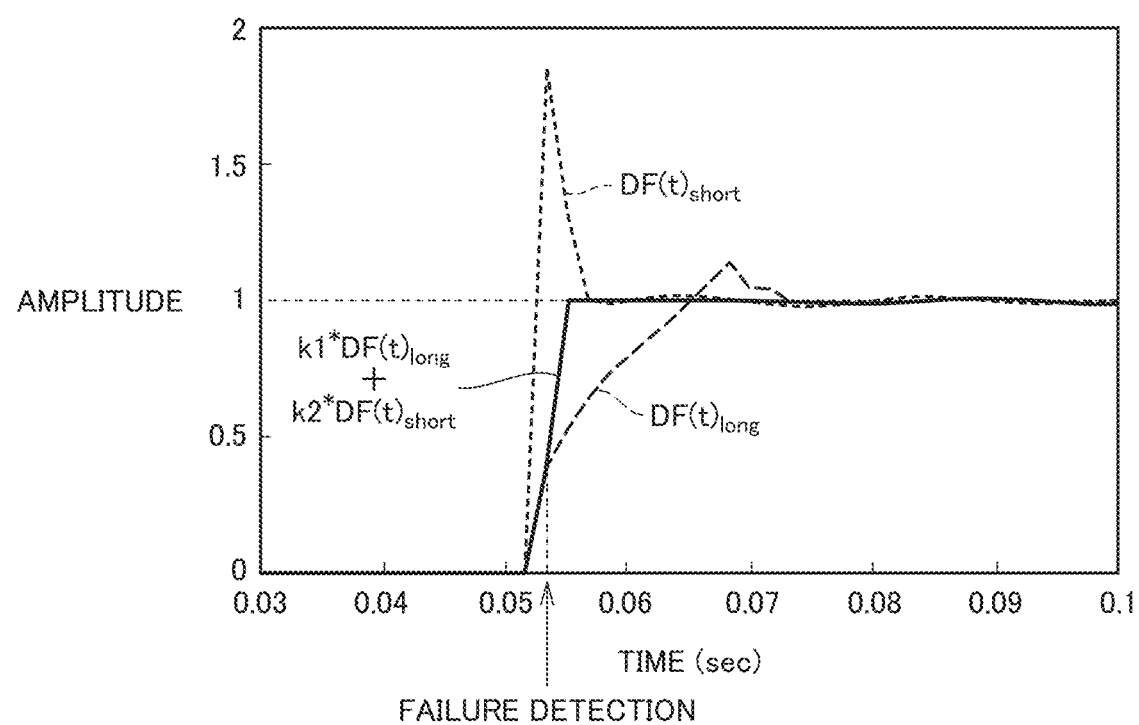
FIG. 11 shows amplitude value calculation results based on the filter output waveforms in FIG. 10.

FIG. 11 shows amplitude value calculation results based on the filter output waveforms in FIG. 10. In FIG. 11, amplitude value $DF(t)_{long}$ of the output signal of first filter 81 is shown by a thick broken line, amplitude value $DF(t)_{short}$ of the output signal of second filter 82 is shown by a thin broken line, and amplitude value $(k1*DF(t)_{long}+k2*DF(t)_{short})$ of the output signal of coefficient calculation unit 90 is shown by a solid line. Coefficients k1 and k2 are shown in FIG. 8 and determined as follows.

First, a failure occurs at time t=0.05. Simultaneously with the occurrence of the failure, the failure of the power system is detected by failure determination unit 86. However, in order to prevent a malfunction caused by an unexpected surge current or the like, failure determination unit 86 provides a notification of the failure detection when the failure state continues for 2T (T represents the relay calculation cycle) (i.e., at time t=0.0533 second). In other words, failure determination unit 86 detects an output abnormality of third filter 83 three times, i.e., when the failure occurs, when 1T has elapsed from the occurrence of the failure, and when 2T has elapsed from the occurrence of the failure, and then, failure determination unit 86 provides a notification of the failure detection. Herein, the time period of 2T is referred to as "verification time period". It is also conceivable that an on delay timer having a delay time of 2T is provided in the latter stage of failure determination unit 86.

Until the failure is detected, first coefficient k1 is set at 1 and second coefficient k2 is set at 0. After the time period of 1T elapses from the failure detection (i.e., after time t=0.055 second), coefficients k1 and k2 are determined such that the amplitude value of the output signal of coefficient calculation unit 90 becomes equal to 1 that is an amplitude of the input time-series data (i.e., such that an overshoot is prevented). As a result, coefficients k1 and k2 can be set such that the amplitude value of the output signal of coefficient calculation unit 90 increases abruptly to the amplitude value of the input signal after the failure occurs, and thereafter, hardly changes as shown in FIG. 11.

Figure 12:
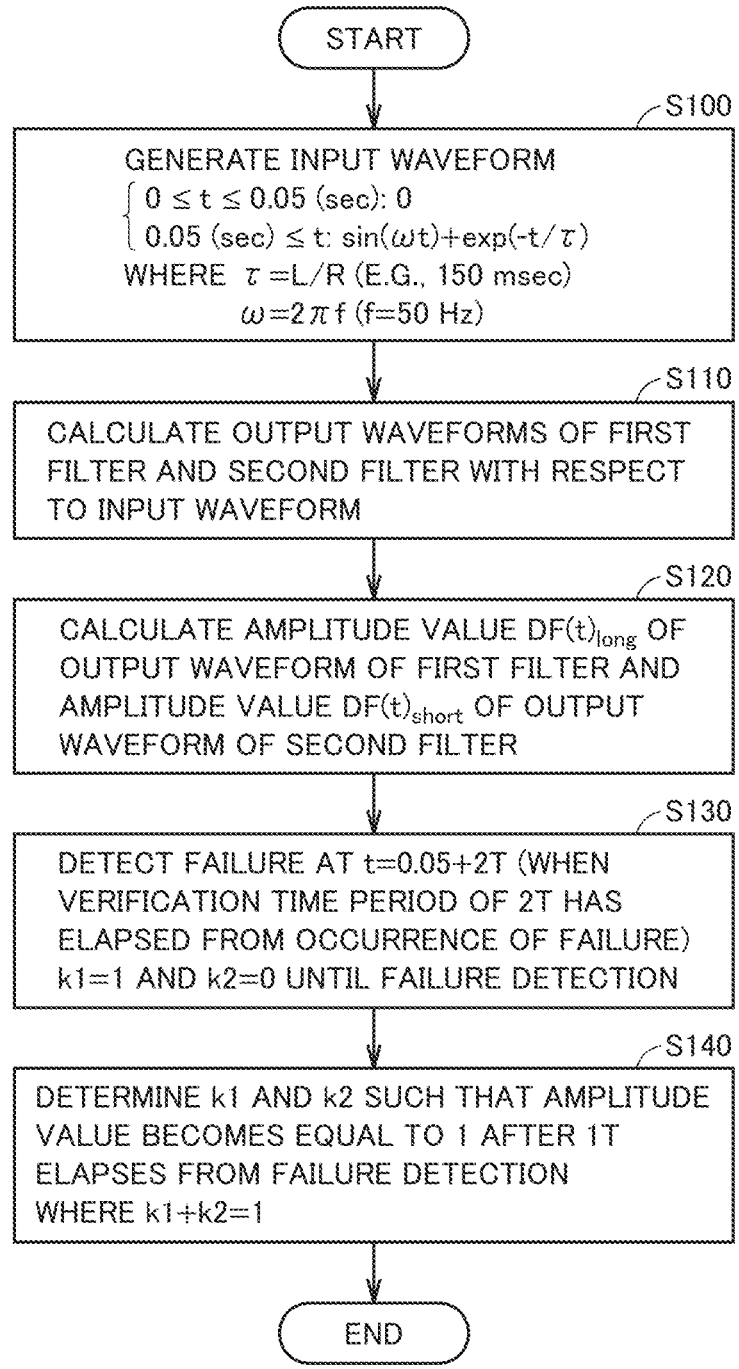
FIG. 12 is a flowchart showing a procedure for determining coefficient values k1 and k2.

FIG. 12 is a flowchart showing a procedure for determining coefficient values k1 and k2. Each step in FIG. 12 can be implemented by a computer that operates in accordance with a program.

First, in step S100, the computer generates virtual time-series data as an input signal in accordance with the above-described equations (4A) and (4B). The virtual time-series data corresponds to data when the DC component of the power system is maximized at the time of a failure.

Next, in step S110, the computer calculates output waveforms of first filter 81 and second filter 82 based on the input time-series data. Next, in step S120, the computer calculates a time-varying waveform of amplitude value $DF(t)_{long}$ of the output signal of first filter 81 and a time-varying waveform of amplitude value $DF(t)_{short}$ of the output signal of second filter 82.

Next, in step S130, the computer assumes that failure determination unit 86 detects a failure when 2T (T represents the relay calculation cycle) has elapsed from the time of the occurrence of the failure (t=0.05 second), i.e., at t=0.05+2T. Coefficient value k1 is set at 1 and coefficient value k2 is set at 0 until the failure detection time.

Next, in step S140, the computer determines coefficients k1 and k2 such that the amplitude value of the output signal of coefficient calculation unit 90 becomes equal to the amplitude value (=1) of the input signal after the start time, which is, for example, a time point at which 1T has elapsed from the failure detection. The timing of switching the values of coefficients k1 and k2 from the values when the power system is normal to the values when the failure is detected is not limited to after 1T elapses from the failure detection as described above. For example, coefficients k1 and k2 may be switched simultaneously with the failure detection. In addition, k1+k2=1 may be set for the above-described values of coefficients k1 and k2. Furthermore, each of k1 and k2 may be set at a negative value.

[Specific Example of Third Filter]

Next, third filter 83 will be described. A 180° summation filter is used as third filter 83. The 180° summation filter is expressed as follows:

$$i(t)+i(t-6) \qquad (5).$$

Where, relay calculation cycle T is 30° in electrical angle. Therefore, a window length of the 180° summation filter is 180° in electrical angle.

Figure 13:
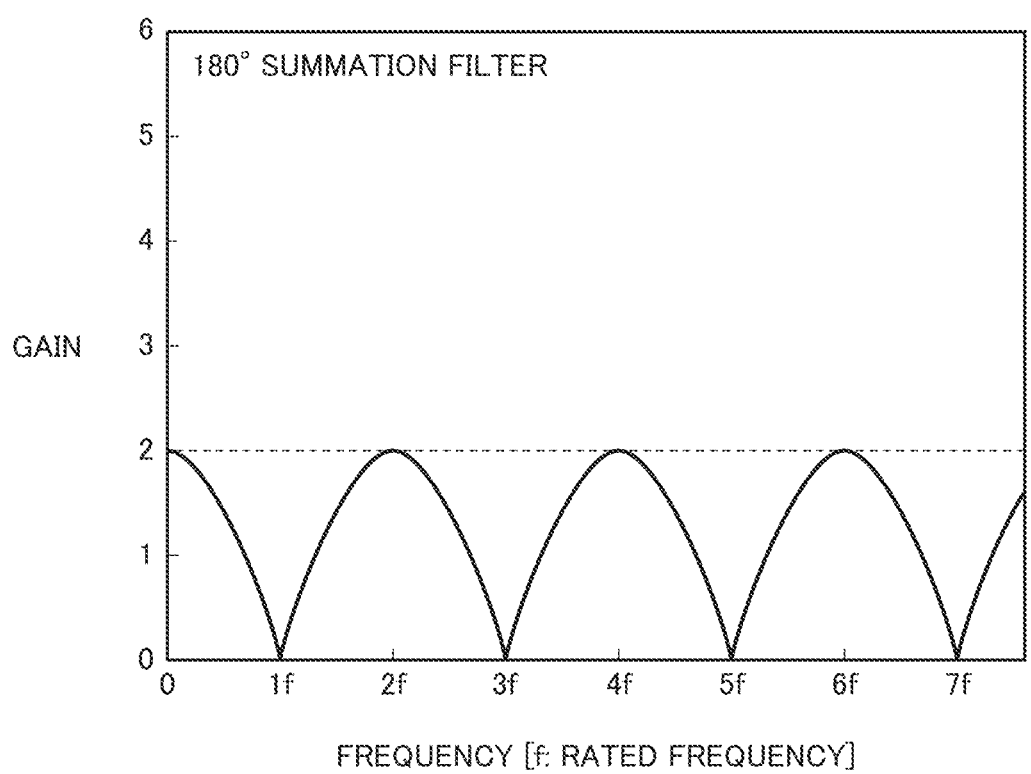
FIG. 13 shows a gain characteristic of a 180° summation filter.

FIG. 13 shows a gain characteristic of the 180° summation filter. As shown in FIG. 13, a fundamental wave component and odd harmonic components can be completely eliminated, whereas a DC component and even harmonic components pass through the 180° summation filter. By eliminating the fundamental wave component using the 180° summation filter as described above, determination of a failure of the power system becomes easy.

Figure 14:
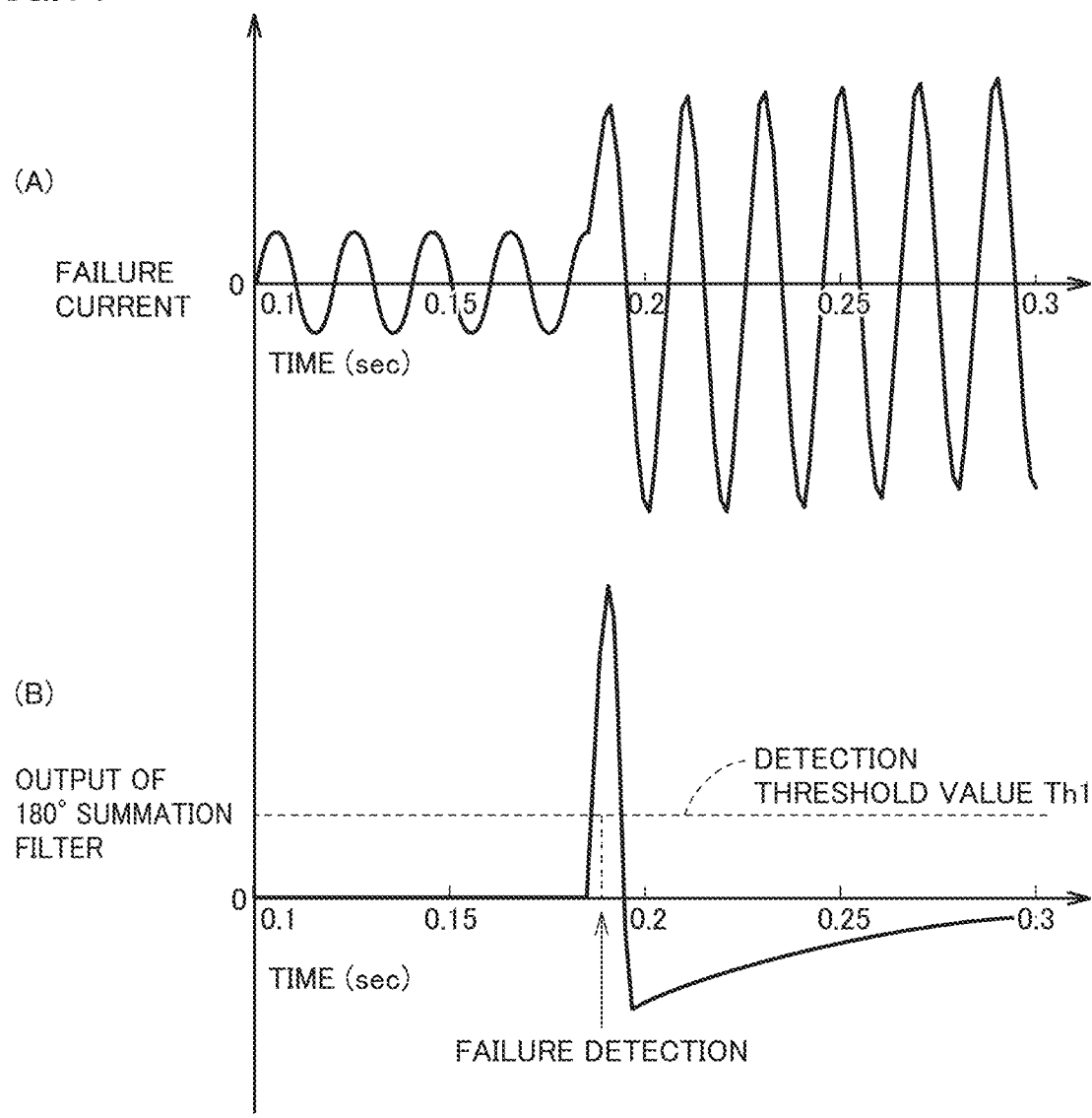
FIG. 14 shows an example output waveform of the 180° summation filter.

FIG. 14 shows an example output waveform of the 180° summation filter. FIG. 14(A) shows an example waveform of an input current signal. A failure occurs in the power system at around the time of 0.185 second.

FIG. 14(B) shows an output signal waveform of the 180° summation filter with respect to the input signal waveform in FIG. 14(A). As shown in FIG. 14(B), the input signal waveform changes greatly before and after the failure is detected, and thus, an output exceeding a detection threshold value Th1 is obtained.

[Effect of Second Embodiment]

In the second embodiment, the specific examples of first filter 81, second filter 82 and third filter 83 in the first embodiment, and the specific method for setting coefficients k1 and k2 have been described. Similarly to the first embodiment, there can be provided a protection relay that can suppress the occurrence of an overshoot and achieve both the response speed and the operation determination accuracy.

Third Embodiment

In a third embodiment, another method for setting coefficients k1 and k2 in coefficient calculation unit 90 will be described.

Figure 15:
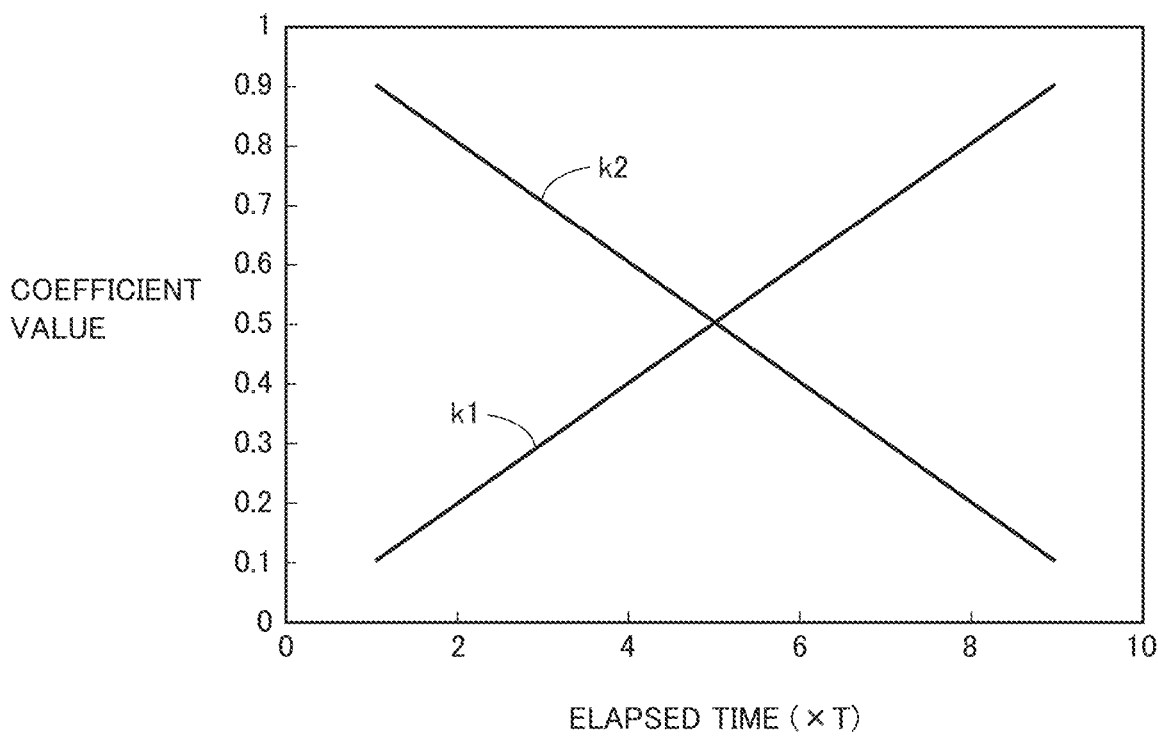
FIG. 15 shows setting examples of coefficient values k1 and k2 in a third embodiment.

FIG. 15 shows setting examples of coefficient values k1 and k2 in the third embodiment. In FIG. 15(A), coefficient values k1 and k2 are shown in the form of a table, and in FIG. 15(B), coefficient values k1 and k2 are shown in the form of a graph. In FIG. 15(A), the time elapsed from the failure detection time is shown with respect to relay calculation cycle T (T=30°). Coefficient value k1 is set at 1 and coefficient value k2 is set at 0 until the failure detection time, for example.

Referring to FIG. 15, when 1T has elapsed from the detection of a failure of the power system, coefficient setting unit 93 in FIG. 3 abruptly decreases coefficient k1 to 0.1 and abruptly increases coefficient k2 to 0.9. Thereafter, coefficient setting unit 93 gradually increases coefficient k1 and gradually decreases coefficient k2 with a lapse of time. As shown in FIG. 15(B), k1 and k2 change linearly in the third embodiment.

Figure 16:
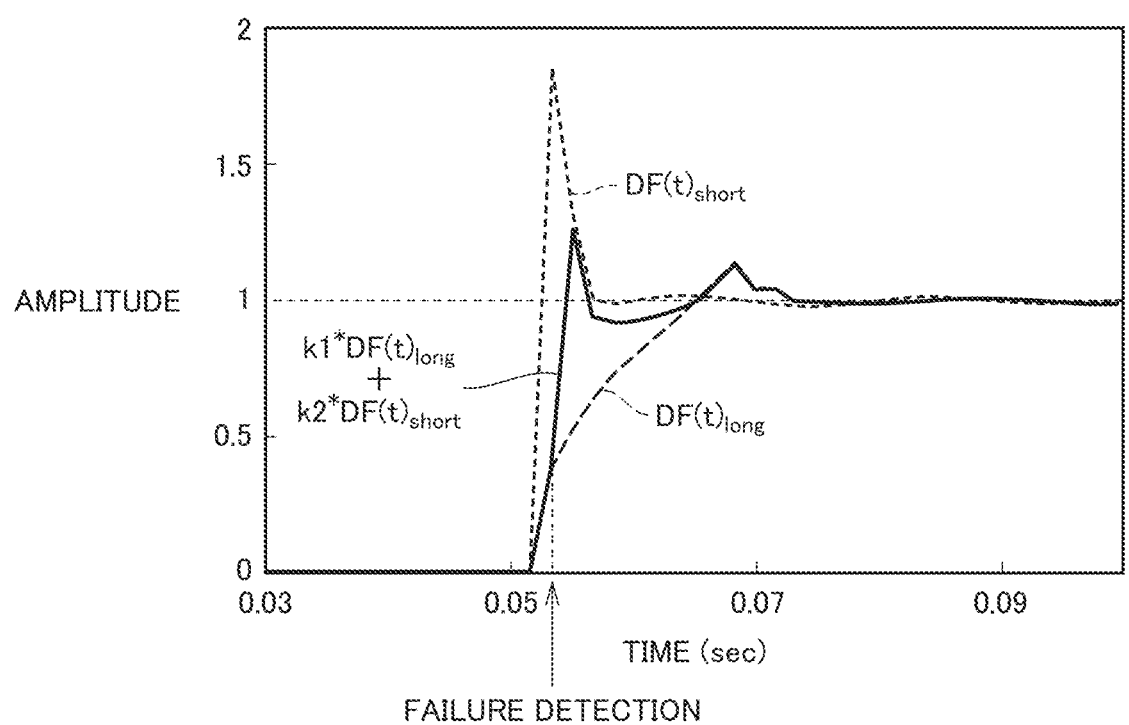
FIG. 16 shows amplitude value calculation results based on filter output signal waveforms with respect to the input signal waveform in FIG. 9, in the settings of coefficient values k1 and k2 shown in FIG. 15.

FIG. 16 shows amplitude value calculation results based on the filter output signal waveforms with respect to the input signal waveform in FIG. 9, in the settings of coefficient values k1 and k2 shown in FIG. 15. In FIG. 16, amplitude value $DF(t)_{long}$ of the output signal of first filter 81 is shown by a thick broken line, amplitude value $DF(t)_{short}$ of the output signal of second filter 82 is shown by a thin broken line, and amplitude value $(k1*DF(t)_{long}+k2*DF(t)_{short})$ of the output signal of coefficient calculation unit 90 is shown by a solid line.

Similarly to FIG. 11, a failure occurs in the power system at time t=0.05 second. Failure determination unit 86 provides a notification of the failure detection when the failure state continues for 2T (T represents the relay calculation cycle) (i.e., at time t=0.0533 second).

FIG. 16 is compared with FIG. 11. Then, although the response performance to the input signal is at the same level, an overshoot of the output signal occurs in FIG. 16. However, a degree of the overshoot and a time period of the overshoot can be reduced, as compared with the case of using second filter 82 (60° difference filter) alone.

When the configuration in the third embodiment is incorporated into an actual overcurrent relay, it is necessary to prevent a malfunction caused by an unexpected surge current during a period other than a failure. Thus, protection relay 50 is configured to output an operation signal to the outside when the state of the operation flag=1 continues for approximately the several times of relay calculation cycle T (this time period is referred to as "verification time period"). In the protection relay according to the third embodiment, the time period of the overshoot can be shortened as compared with the conventional art, and thus, the above-described verification time period can be shortened. As a result, there can be provided a protection relay that can operate at high speed.

Fourth Embodiment

In a fourth embodiment, still another method for setting coefficients k1 and k2 in coefficient calculation unit 90 will be described.

Figure 17:
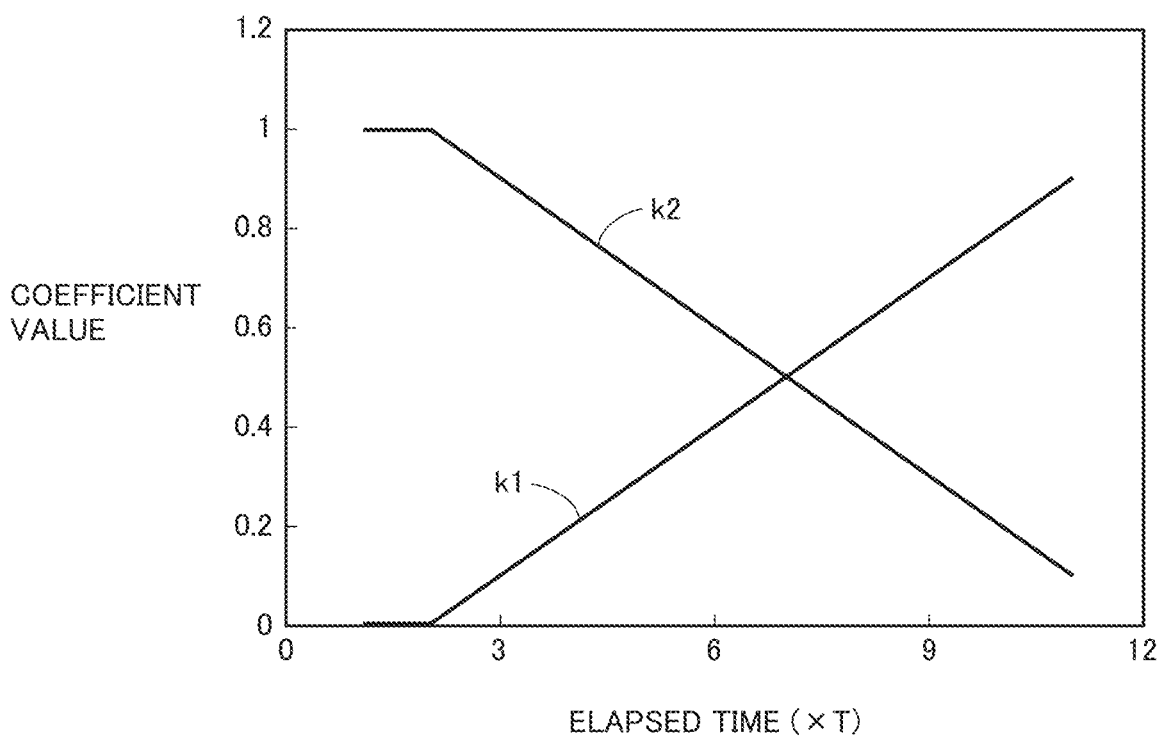
FIG. 17 shows setting examples of coefficient values k1 and k2 in a fourth embodiment.

FIG. 17 shows setting examples of coefficient values k1 and k2 in the fourth embodiment. In FIG. 17(A), coefficient values k1 and k2 are shown in the form of a table, and in FIG. 17(B), coefficient values k1 and k2 are shown in the form of a graph. In FIG. 17(A), the time elapsed from the failure detection time is shown with respect to relay calculation cycle T (T=30°). Coefficient value k1 is set at 1 and coefficient value k2 is set at 0 until the failure detection time, for example.

Referring to FIG. 17, when 1T has elapsed from the detection of a failure of the power system, coefficient setting unit 93 in FIG. 3 abruptly decreases coefficient k1 to 0 and abruptly increases coefficient k2 to 1. Thereafter, coefficient setting unit 93 maintains the coefficient values during 2T (T represents the relay calculation cycle). Thereafter, coefficient setting unit 93 gradually increases coefficient k1 and gradually decreases coefficient k2 with a lapse of time. As shown in FIG. 17(B), k1 and k2 change linearly in the fourth embodiment.

Figure 18:
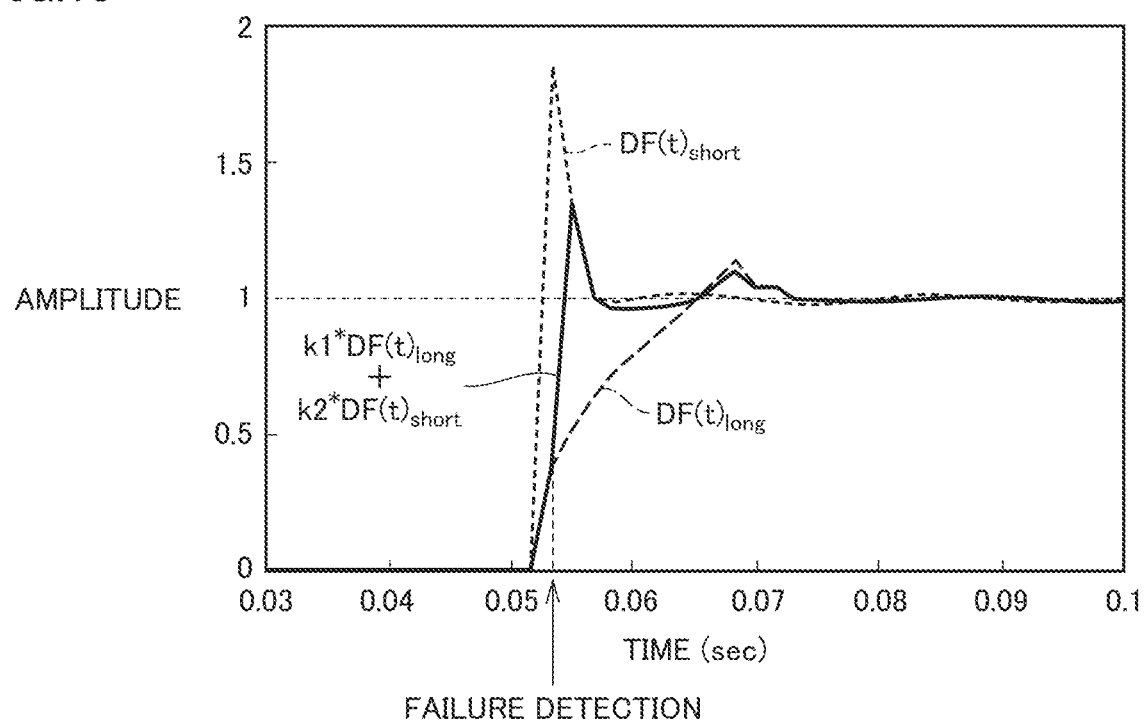
FIG. 18 shows amplitude value calculation results based on filter output signal waveforms with respect to the input signal waveform in FIG. 9, in the settings of coefficient values k1 and k2 shown in FIG. 17.

FIG. 18 shows amplitude value calculation results based on the filter output signal waveforms with respect to the input signal waveform in FIG. 9, in the settings of coefficient values k1 and k2 shown in FIG. 17. In FIG. 18, amplitude value $DF(t)_{long}$ of the output signal of first filter 81 is shown by a thick broken line, amplitude value $DF(t)_{short}$ of the output signal of second filter 82 is shown by a thin broken line, and amplitude value ($k1*DF(t)_{long}+k2*DF(t)_{short}$) of the output signal of coefficient calculation unit 90 is shown by a solid line.

Similarly to FIG. 11, a failure occurs in the power system at time t=0.05 second. Failure determination unit 86 provides a notification of the failure detection when the failure state continues for 2T (T represents the relay calculation cycle) (i.e., at time t=0.0533 second).

FIG. 18 is compared with FIG. 16. Then, in FIG. 18, although the responsiveness to the input signal is slightly faster, an overshoot of the output signal is greater. However, a degree of the overshoot and a time period of the overshoot can be reduced, as compared with the case of using second filter 82 (60° difference filter) alone. Therefore, the above-described verification time period can be shortened as compared with the conventional art, and thus, there can be provided a protection relay that can operate at higher speed than the conventional art.

Fifth Embodiment

A fifth embodiment is a modification of the first embodiment. In the fifth embodiment, the description will be given of the case in which the output signal of first filter 81 and the output signal of second filter 82 are in phase or out of phase with each other by 180° with respect to a fundamental wave frequency. In this case, the instantaneous values of the output signals of first filter 81 and second filter 82 can be integrated (added or subtracted), without obtaining the amplitude values of the output signals of first filter 81 and second filter 82. As a result, an operation delay can be further reduced. Furthermore, the technique of the present disclosure is also applicable to relay calculation using an instantaneous value in a distance relay or the like. The detailed description will be given below with reference to the figures.

Figure 19:
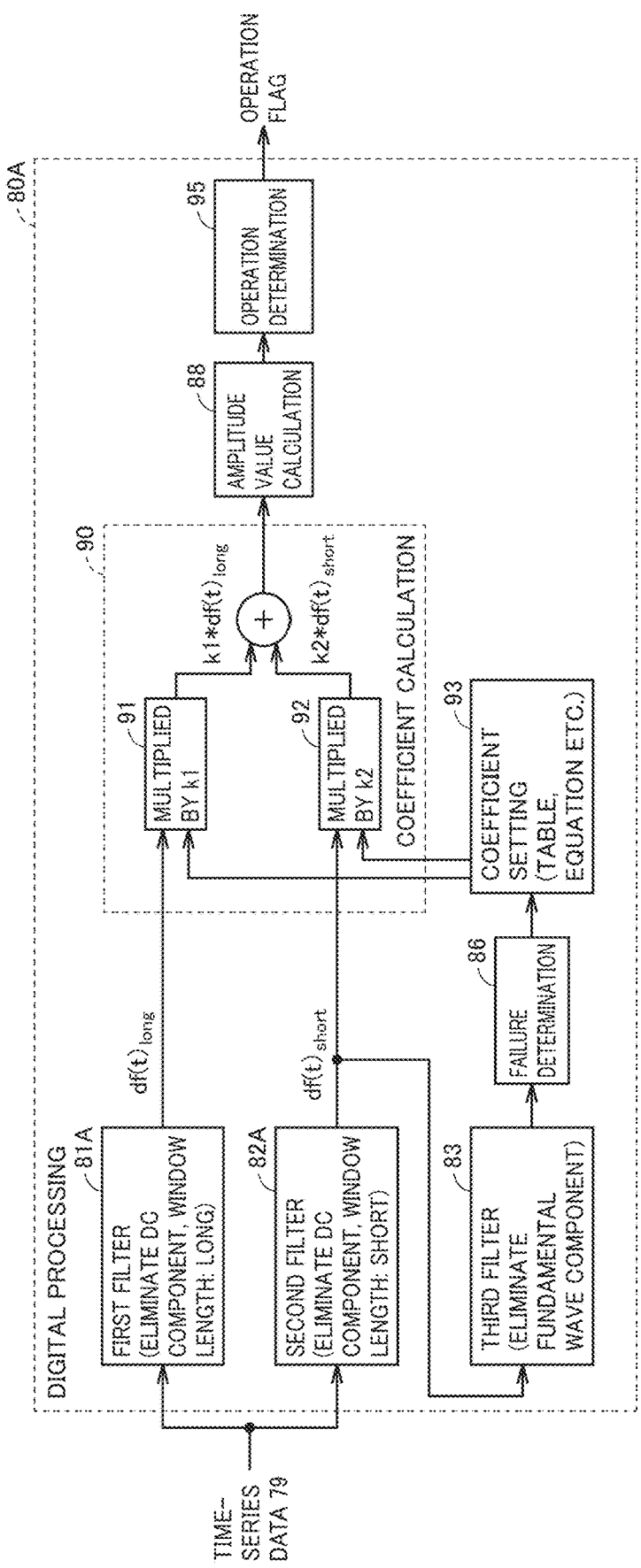
FIG. 19 is a functional block diagram for illustrating digital processing implemented by the arithmetic circuit in FIG. 2 in a protection relay according to a fifth embodiment.

FIG. 19 is a functional block diagram for illustrating digital processing implemented by the arithmetic circuit in FIG. 2 in the protection relay according to the fifth embodiment. FIG. 19 is a functional block diagram showing the contents of digital processing by the CPU.

Digital processing unit 80A in FIG. 19 is different from digital processing unit 80 in FIG. 3 in that amplitude value calculation units 84 and 85 are not provided. Therefore, coefficient calculation unit 90 multiplies an output signal $df(t)_{long}$ of first filter 81 by coefficient k1, multiplies output signal $df(t)_{short}$ of second filter 82 by coefficient k2, and adds multiplication results.

Furthermore, digital processing unit 80A in FIG. 19 is different from digital processing unit 80 in FIG. 3 in that digital processing unit 80A in FIG. 19 further includes an amplitude value calculation unit 88 provided between coefficient calculation unit 90 and operation determination unit 95. Amplitude value calculation unit 88 obtains an amplitude value of the output signal ($k1*df(t)_{long}+k2*df(t)_{short}$) of coefficient calculation unit 90. Operation determination unit 95 performs operation determination based on the amplitude value calculated by amplitude value calculation unit 88.

Amplitude value calculation unit 88 is required when amplitude value calculation is necessary for operation determination, such as in the case of an overcurrent relay. However, amplitude value calculation unit 88 is not required in the case of a distance relay or the like that performs operation determination using an instantaneous value. In this case, operation determination unit 95 performs operation determination based on the output signal ($k1*df(t)_{long}+k2*df(t)_{short}$) of coefficient calculation unit 90.

Since the remaining portions in FIG. 19 are the same as those of FIG. 3, the same or corresponding portions will be denoted by the same reference characters and the description will not be repeated.

Figure 20:
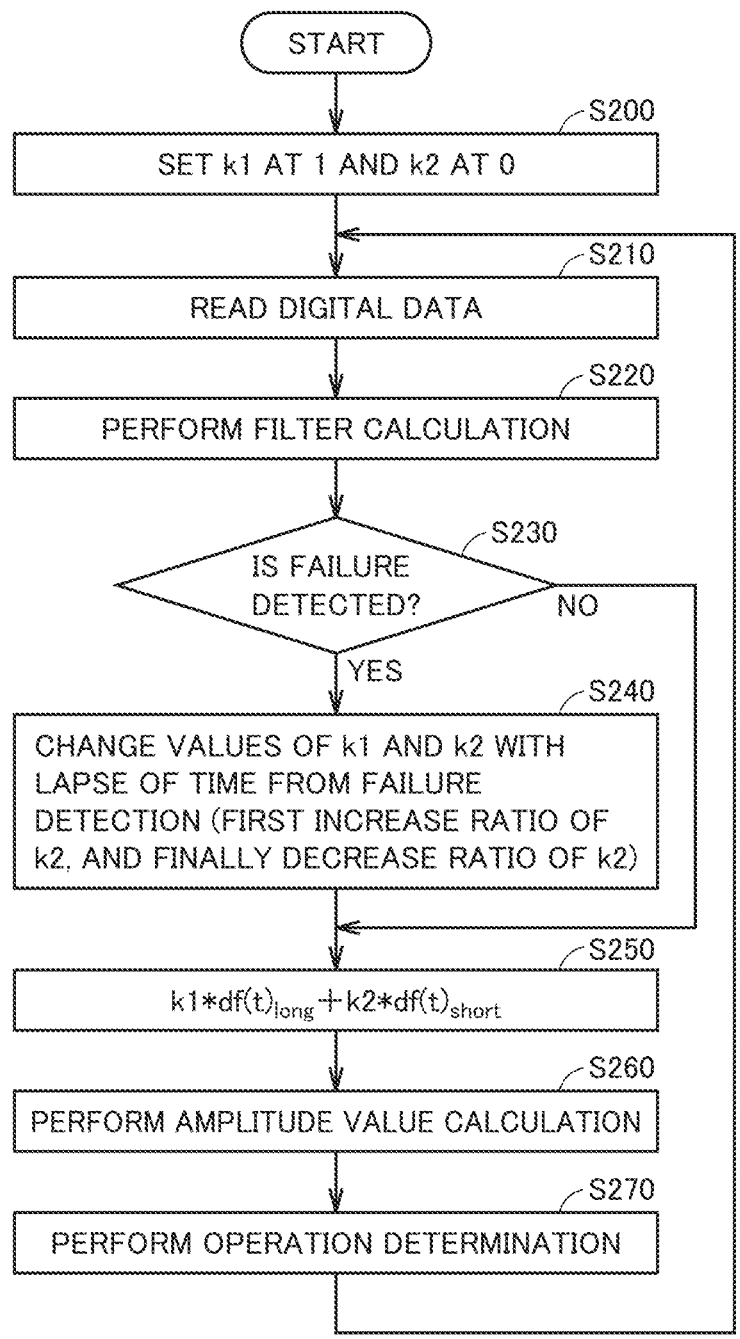
FIG. 20 is a flowchart showing a process procedure by a digital processing unit in FIG. 19.

FIG. 20 is a flowchart showing a process procedure by the digital processing unit in FIG. 19. The flowchart in FIG. 20 shows the operation of the digital processing unit in FIG. 19 in chronological order. Each step in FIG. 20 is performed by CPU 61 in FIG. 2.

First, in step S200 in FIG. 20, CPU 61 sets coefficients k1 and k2 at initial values when the power system does not have a failure. For example, CPU 61 sets k1 at 1 and k2 at 0. By using the output of first filter 81 having a longer window length, erroneous determination based on a surge current or the like can be prevented.

Next, in step S210, CPU 61 extracts the data necessary for filter calculation from RAM 62. As described above, the time-series current data and/or voltage data detected from the power system and subjected to A/D conversion is stored in RAM 62.

Next, in step S220, using the read data, CPU 61 performs filter calculation with first filter 81, second filter 82 and third filter 83 described above.

Each of first filter 81 and second filter 82 is an FIR filter that eliminates a DC component. Furthermore, first filter 81 and second filter 82 are characterized in that the window length of first filter 81 is longer than the window length of second filter 82. Although both first filter 81 and second filter 82 pass at least a part of a fundamental wave component, the fundamental wave component is more attenuated and a content of harmonic components is higher in second filter 82 having a shorter window length.

Third filter 83 is an FIR filter that eliminates the fundamental wave component.

Next, in step S230, CPU 61 determines whether or not the power system has a failure, based on the output of third filter 83. For example, when a state in which the magnitude of the output of third filter 83 is larger than a preset threshold value continues for a predetermined verification time period (e.g., 2T), CPU 61 determines that the power system has a failure.

When the failure of the power system is not detected as a result of the above-described determination (NO in step S230), CPU 61 uses the initialized values of coefficients k1 and k2 to multiply output signal $df(t)_{long}$ of first filter 81 by coefficient k1 and multiply output signal $df(t)_{short}$ of second filter 82 by coefficient k2 in step S250. CPU 61 adds multiplication results (when a phase difference is 0°). When the phase difference is 180°, CPU 61 subtracts the multiplication results.

Next, in step S260, CPU 61 calculates an amplitude value of the calculated signal $(k1*df(t)_{long}+k2*df(t)_{short})$. Any known method may be used as a method for amplitude value calculation, without particular limitation.

Next, in step S270, CPU 61 performs operation determination based on a result of amplitude value calculation. In this case, the result of amplitude value calculation is substantially determined by the output of first filter 81, and thus, erroneous determination in the overcurrent relay based on an unexpected surge current or the like can be prevented. Thereafter, the procedure is repeated from step S210.

In contrast, when the failure of the power system is detected as a result of the determination in step S230, CPU 61 changes the values of coefficients k1 and k2 based on the preset table or equation, with a lapse of time from the failure detection time (step S240). Specifically, when 1T has elapsed from the failure detection, CPU 61 increases a ratio of coefficient k2 to coefficient k1, and finally decreases a ratio of coefficient k2 to coefficient k1. In this case, the values of coefficients k1 and k2 may be changed to satisfy the relation of k1+k2=1.

Next, in step S250, CPU 61 calculates $k1*df(t)_{long}+k2*df(t)_{short}$, using the values of coefficients k1 and k2 changed in step S240. Next, in step S260, CPU 61 calculates an amplitude value of the output signal $(k1*df(t)_{long}+k2*df(t)_{short})$ of coefficient calculation unit 90.

Next, in step S270, CPU 61 performs operation determination based on an output result of amplitude value calculation. For example, in the case of the overcurrent relay, when the result of amplitude value calculation is larger than a threshold value, CPU 61 sets an operation flag at 1, to thereby open the circuit breaker.

In the foregoing description, in the case of a relay element that performs operation determination using an instantaneous value, step S260 does not need to be performed.

As described above, the protection relay according to the fifth embodiment further includes the condition that the output signal of first filter 81 and the output signal of second filter 82 are in phase or out of phase with each other by 180° with respect to the fundamental wave frequency. In this case, the instantaneous values of the output signals of first filter 81 and second filter 82 can be integrated (added in the case of being in phase, or subtracted in the case of being out of phase), without obtaining the amplitude values of the output signals of first filter 81 and second filter 82. When a phase difference between the output signal of first filter 81 and the output signal of second filter 82 is not 0° or 180°, the phase difference between the output signals of the filters is corrected to 0° or 180° by phase correction, and the protection relay according to the fifth embodiment can thereby be implemented. In this case, at least one of first filter 81 and second filter 82 includes a phase shifter that changes a phase of the time-series data obtained as the filter calculation result. As a result, an operation delay can be further reduced. Furthermore, the technique of the present disclosure is also applicable to relay calculation using an instantaneous value in a distance relay or the like.

Sixth Embodiment

In a sixth embodiment, a specific example of first filter 81 described in the fifth embodiment will be described. A 60° difference filter can be used as a specific configuration of second filter 82, and a 180° summation filter can be used as a specific configuration of third filter 83. Since the filter characteristics of these filters have been described in the second embodiment, the description will not be repeated. The set values in FIG. 15 described in the third embodiment are used as the values of coefficients k1 and k2.

[Specific Configuration Example of First Filter]

First filter 81 is formed by connecting a plurality of summation filters and a difference filter in series. Specifically, when i(t) represents an input signal at a current time point, filters (a) to (f) described below are connected in series. Relay calculation cycle T is 30° in electrical angle.

$$(a) i_1(t)=i(t)+i(t-1) \tag{6A}$$

$$(b) i_2(t)=i_1(t)-i_1(t-1) \tag{6B}$$

$$(c) i_3(t)=i_2(t)+i_2(t-2) \tag{6C}$$

$$(d) i_4(t)=i_3(t)+i_3(t-3) \tag{6D}$$

$$(e) i_5(t)=i_4(t)+\sqrt{(3)}*i_4(t-1)+i_4(t-2) \tag{6E}$$

$$(f) i_6(t)=-i_5(t)-i_5(t-4) \tag{6F}$$

In the above-described equations, input signal i(t) is input to a 30° summation filter expressed by the equation (6A). Next, an output $i_1(t)$ of the 30° summation filter expressed by the equation (6A) is input to a 30° difference filter expressed by the equation (6B). Next, an output $i_2(t)$ of the 30° difference filter expressed by the equation (6B) is input to a 60° summation filter expressed by the equation (6C). The same operation is performed subsequently, so that an output signal $i_6(t)$ is finally obtained with respect to input signal i(t).

According to the above-described configuration of first filter 81, a phase lead with respect to the fundamental wave frequency is 60°, which is the same as that of the 60° difference filter that forms second filter 82. Furthermore, the window length of first filter 81 is 390° in electrical angle and is longer than the window length (60° in electrical angle) of second filter 82.

[Simulation Result]

A simulation result in the case of using above-described first filter 81 will be described.

Figure 21:
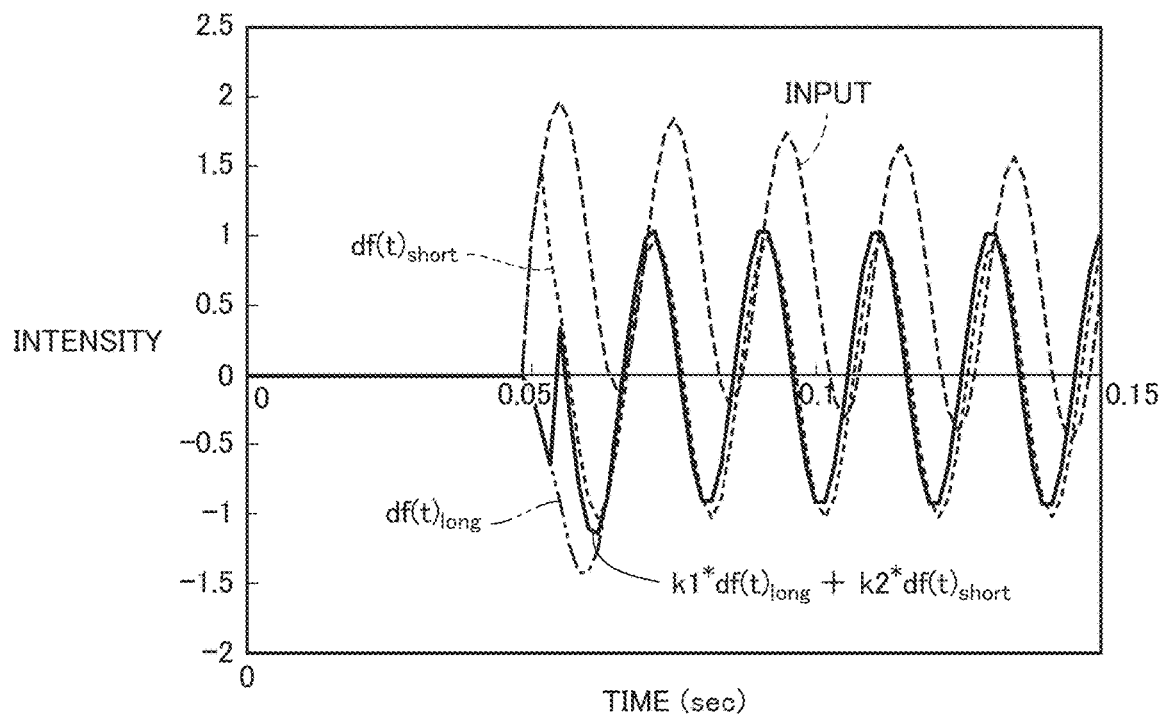
FIG. 21 shows filter output waveforms with respect to the input signal waveform in FIG. 9 in the protection relay according to the fifth embodiment.

FIG. 21 shows filter output waveforms with respect to the input signal waveform in FIG. 9 in the protection relay according to the fifth embodiment. In FIG. 21, the input signal is shown by a thick broken line, output signal $df(t)_{long}$ of first filter 81 is shown by a two-dot chain line, and output signal $df(t)_{short}$ of second filter 82 is shown by a thin broken line. In addition, the output signal ($k1*df(t)_{long}+k2*df(t)_{short}$) of coefficient calculation unit 90 is shown by a solid line.

As shown in FIG. 21, it can be seen that output signal $df(t)_{long}$ of first filter 81, output signal $df(t)_{short}$ of second filter 82, and the output signal of coefficient calculation unit 90 are in phase with each other.

Figure 22:
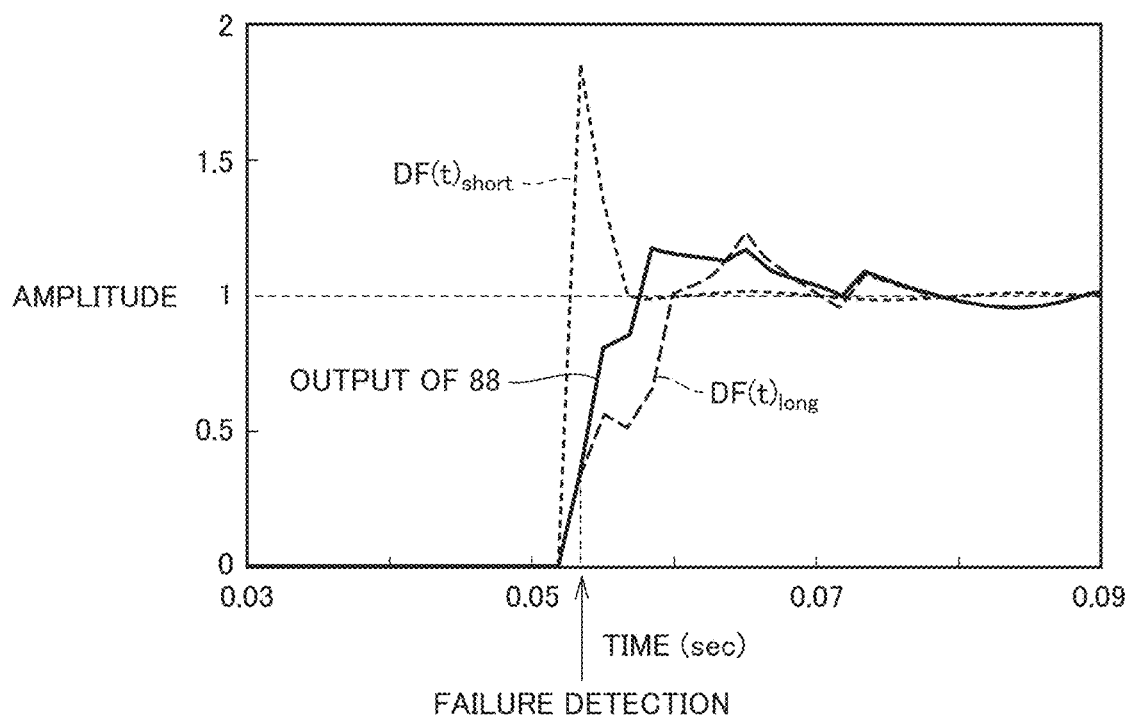
FIG. 22 shows amplitude value calculation results based on the filter output waveforms in FIG. 21.

FIG. 22 shows amplitude value calculation results based on the filter output waveforms in FIG. 21. In FIG. 22, an amplitude value (i.e., output signal of amplitude value calculation unit 88) of the output signal ($k1*df(t)_{long}+k2*df(t)_{short}$) of coefficient calculation unit 90 is shown by a solid line. For reference sake, amplitude value $DF(t)_{long}$ of output signal $df(t)_{long}$ of first filter 81 and amplitude value $DF(t)_{short}$ of output signal $df(t)_{short}$ of second filter 82 are also shown.

Similarly to FIG. 11, a failure occurs in the power system at time t=0.05 second. Failure determination unit 86 provides a notification of the failure detection when the failure state continues for 2T (T represents the relay calculation cycle) (i.e., at time t=0.0533 second).

The result shown in FIG. 22 is compared with the result in FIG. 16 calculated using the same coefficients k1 and k2. Then, it can be seen that an overshoot is suppressed at almost the same level. Thus, by using the above-described configuration example of first filter 81, there can be provided a protection relay that can perform operation determination at higher speed and with a higher degree of accuracy than the conventional art.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 50 protection relay; 51 analog input circuit; 57 A/D converter; 60 arithmetic circuit; 61 CPU; 62 RAM; 63 ROM; 64 memory; 71 digital input circuit; 72 digital output circuit; 79 time-series data; 80, 80A digital processing unit; 81 first filter; 82 second filter; 83 third filter; 84, 85, 88 amplitude value calculation unit; 86 failure determination unit; 90 coefficient calculation unit; 91, 92 multiplier; 93 coefficient setting unit; 94 adder; 95 operation determination unit; T relay calculation cycle; k1 first coefficient; k2 second coefficient.

The invention claimed is:

1. A protection relay comprising:
an analog input circuit to generate time-series data by detecting a signal indicating current or voltage in a power system and performing Analog-to-Digital (A/D) conversion of the detected signal; and
an arithmetic circuit to perform digital processing based on the time-series data,
the arithmetic circuit including:
a first filter to attenuate or eliminate a DC component and at least some orders of harmonic components of the power system in the time-series data, and pass at least a part of a fundamental wave component of the power system in the time-series data, the first filter having a first window length;
a second filter to attenuate or eliminate a DC component and at least some orders of harmonic components of the power system in the time-series data, and pass at least a part of the fundamental wave component in the time-series data, the second filter having a second window length shorter than the first window length;
a coefficient calculation unit to multiply a value based on an output signal of the first filter by a first coefficient, multiply a value based on an output signal of the second filter by a second coefficient, and integrate multiplication results;
an operation determination unit to perform operation determination based on a result of integration by the coefficient calculation unit; and
a coefficient setting unit to set the first coefficient and the second coefficient, wherein
the coefficient setting unit decreases the first coefficient and increases the second coefficient when a failure of the power system is detected, and thereafter, changes the first coefficient and the second coefficient with a lapse of time.

2. The protection relay according to claim 1, wherein the arithmetic circuit further includes:
a third filter to eliminate the fundamental wave component in the time-series data; and
a failure determination unit to detect the failure of the power system based on an output signal of the third filter.

3. The protection relay according to claim 2, wherein
the first filter includes a full cycle cosine filter,
the second filter includes a 60° difference filter, and
the third filter includes a 180° summation filter.

4. The protection relay according to claim 1, wherein the arithmetic circuit further includes:
a first amplitude value calculation unit to calculate an amplitude value of the output signal of the first filter; and
a second amplitude value calculation unit to calculate an amplitude value of the output signal of the second filter, and
the coefficient calculation unit multiplies the amplitude value calculated by the first amplitude value calculation unit by the first coefficient, and multiplies the amplitude value calculated by the second amplitude value calculation unit by the second coefficient.

5. The protection relay according to claim 1, wherein
the output signal of the first filter and the output signal of the second filter are in phase or out of phase with each other by 180° with respect to a frequency of the fundamental wave component,
the coefficient calculation unit multiplies the output signal of the first filter by the first coefficient, multiplies the output signal of the second filter by the second coefficient, and integrates multiplication results, and
the operation determination unit performs operation determination based on the result of integration by the coefficient calculation unit.

6. The protection relay according to claim 1, wherein
the coefficient setting unit sets the first coefficient and the second coefficient based on a predetermined correspondence relation between the first and second coefficients and a time elapsed after the failure is detected.

7. The protection relay according to claim 6, wherein
the correspondence relation is determined such that the result of integration is equal in amplitude to an input signal after the failure of the power system is detected, based on virtual time-series data in which a DC current component of the power system at the time of the failure is maximized.

8. The protection relay according to claim 1, wherein the coefficient setting unit decreases the first coefficient and increases the second coefficient when the failure of the power system is detected, and thereafter, increases the first coefficient and decreases the second coefficient and then again decreases the first coefficient and increases the second coefficient, and thereafter, increases the first coefficient and decreases the second coefficient.

9. The protection relay according to claim 1, wherein the coefficient setting unit decreases the first coefficient and increases the second coefficient when the failure of the power system is detected, and thereafter, gradually increases the first coefficient and gradually decreases the second coefficient with a lapse of time.

10. The protection relay according to claim 9, wherein the coefficient setting unit sets the first coefficient at 0 and the second coefficient at 1 when the failure of the power system is detected.

11. The protection relay according to claim 1, wherein the coefficient setting unit sets the first coefficient at 0 and the second coefficient at 1 when the failure of the power system is detected, and maintains this state, and thereafter, gradually increases the first coefficient and gradually decreases the second coefficient with a lapse of time.

12. The protection relay according to claim 1, wherein a sum of the first coefficient and the second coefficient is equal to 1.

* * * * *